(12) United States Patent
Kijima et al.

(10) Patent No.: US 7,731,933 B2
(45) Date of Patent: Jun. 8, 2010

(54) INSULATING TARGET MATERIAL, METHOD OF MANUFACTURING INSULATING TARGET MATERIAL, INSULATING COMPLEX OXIDE FILM, AND DEVICE

(75) Inventors: Takeshi Kijima, Matsumoto (JP); Takamitsu Higuchi, Matsumoto (JP)

(73) Assignee: Seiko Epson Corporation (JP)

( * ) Notice: Subject to any disclaimer, the term of this patent is extended or adjusted under 35 U.S.C. 154(b) by 763 days.

(21) Appl. No.: 11/511,663

(22) Filed: Aug. 29, 2006

(65) Prior Publication Data

US 2007/0045109 A1 Mar. 1, 2007

(30) Foreign Application Priority Data

Aug. 30, 2005 (JP) .............................. 2005-249632

(51) Int. Cl.
*C01G 25/02* (2006.01)
*C23C 14/00* (2006.01)

(52) U.S. Cl. .............................. 423/594.12; 204/298.13; 501/134; 423/598; 423/618; 423/594.17

(58) Field of Classification Search ............ 204/298.13; 423/594.12, 593.1, 598, 618, 594.17; 501/134; 427/126.1, 126.2, 212
See application file for complete search history.

(56) References Cited

U.S. PATENT DOCUMENTS 5,908,802 A * 6/1999 Voigt et al. .................. 501/134
6,284,434 B1 * 9/2001 Kamei et al. ................. 430/319
6,419,849 B1 7/2002 Qiu et al.
2004/0214352 A1 * 10/2004 Kijima et al. ................... 438/3
2005/0271823 A1 * 12/2005 Kijima et al. ............. 427/376.6

FOREIGN PATENT DOCUMENTS

| EP | 1557481 A2 | 7/2005 |
|---|---|---|
| JP | 5-343641 A | 12/1993 |
| JP | 10-176264 | 6/1998 |
| JP | A-10-176264 | 6/1998 |
| JP | 11-335825 | 12/1999 |

OTHER PUBLICATIONS

Examination result issued in corresponding European application.
Griswold E. M., Sayer M., Amm D. T., Calder I.D.: "The influence of niobium-doping on lead zirconate titanate ferroelectric thin films", Canadian Journal of Physics, vol. 69, No. 3-4, Mar. 1991, pp. 260-264, XP009074900.

* cited by examiner

*Primary Examiner*—Stuart Hendrickson
*Assistant Examiner*—Richard M Rump
(74) *Attorney, Agent, or Firm*—Harness, Dickey & Pierce, P.L.C.

(57) ABSTRACT

An insulating target material for obtaining an insulating complex oxide film represented by a general formula $AB_{1-x}C_xO_3$, an element A including at least Pb, an element B including at least one of Zr, Ti, V, W, and Hf, and an element C including at least one of Nb and Ta.

7 Claims, 20 Drawing Sheets

LEAD OCTYLATE

NIOBIUM OCTYLATE

NIOBIUM LEAD OCTYLATE

DIMETHYL SUCCINATE

DIETHYL SUCCINATE

LINEAR SATURATED POLYCARBOXYLIC ACID

DIBUTYL OXALATE

DIMETHYL MALONATE

DIMETHYL ADIPATE

TRIBUTYL CITRATE

TRIETHYL 1,1,2-ETHANETRICARBOXYLATE

TETRAETHYL 1,1,2,2-ETHANETETRACARBOXYLATE

LINEAR UNSATURATED POLYCARBOXYLIC ACID

DIMETHYL MALEATE

DIETHYL FUMARATE

TRANS-ACONITIC ACID

CYCLIC POLYCARBOXYLIC ACID

TRIMESIC ACID

PYROMELLITIC ACID

TRIMETHYL 1,2,4-BENZENETRICARBOXYLATE 1,2,3,4-CYCLOPENTANETETRACARBOXYLIC ACID

US 7,731,933 B2

INSULATING TARGET MATERIAL, METHOD OF MANUFACTURING INSULATING TARGET MATERIAL, INSULATING COMPLEX OXIDE FILM, AND DEVICE

Japanese Patent Application No. 2005-249632, filed on Aug. 30, 2005, is hereby incorporated by reference in its entirety.

BACKGROUND OF THE INVENTION

The present invention relates to an insulating target material suitably used for radio frequency (RF) sputtering, a method of manufacturing the insulating target material, an insulating complex oxide film, and a device.

A target for obtaining a complex oxide film by sputtering is generally obtained as follows. For example, a target for obtaining a perovskite oxide film of the general formula $ABO_3$ is obtained by pulverizing oxide raw materials of the element A and the element B, mixing the oxide raw materials taking the stoichiometric composition into consideration, and sintering the mixture. A material disclosed in JP-A-10-176264 has been known as such a target, for example. This document discloses a sputtering target for a perovskite oxide of the chemical formula $ABO_3$ which has a specific relative density and size. When forming a target using such a sintering method, a treatment at a temperature as high as 900 to 1000° C. is required, as described in the paragraph [0050] of JP-A-10-176264.

SUMMARY

According to a first aspect of the invention, there is provided an insulating target material for obtaining an insulating complex oxide film represented by a general formula $AB_{1-x}C_xO_3$, an element A including at least Pb, an element B including at least one of Zr, Ti, V, W, and Hf, and an element C including at least one of Nb and Ta.

According to a second aspect of the invention, there is provided a method of manufacturing an insulating target material for obtaining an insulating complex oxide film represented by a general formula $AB_{1-x}C_xO_3$, an element A including at least Pb, an element B including at least one of Zr, Ti, V, W, and Hf, an element C including at least one of Nb and Ta, and the method comprising:

forming a first powder of an insulating complex oxide represented by the general formula $AB_{1-x}C_xO_3$; and subjecting the first powder and a first precursor composition including a precursor for forming an insulating complex oxide represented by the general formula $AB_{1-x}C_xO_3$ to hydrothermal synthesis to allow an insulating complex oxide to be grown around particles of the first powder to form a second powder.

According to a third aspect of the invention, there is provided an insulating complex oxide film represented by a general formula $AB_{1-x}C_xO_3$, the insulating complex oxide film being formed by RF sputtering by using the above-described insulating target material and comprising at least one of Si and Ge.

According to a fourth aspect of the invention, there is provided a device comprising:

a base; and the above-described insulating complex oxide film formed above the base.

According to a fifth aspect of the invention, there is provided an insulating target material comprising an element A, an element B, and an element C, the element A including at least Pb, the element B including at least one of Zr, Ti, V, W, and Hf, and the element C including at least one of Nb and Ta.

DETAILED DESCRIPTION OF THE EMBODIMENT

Figure 1:
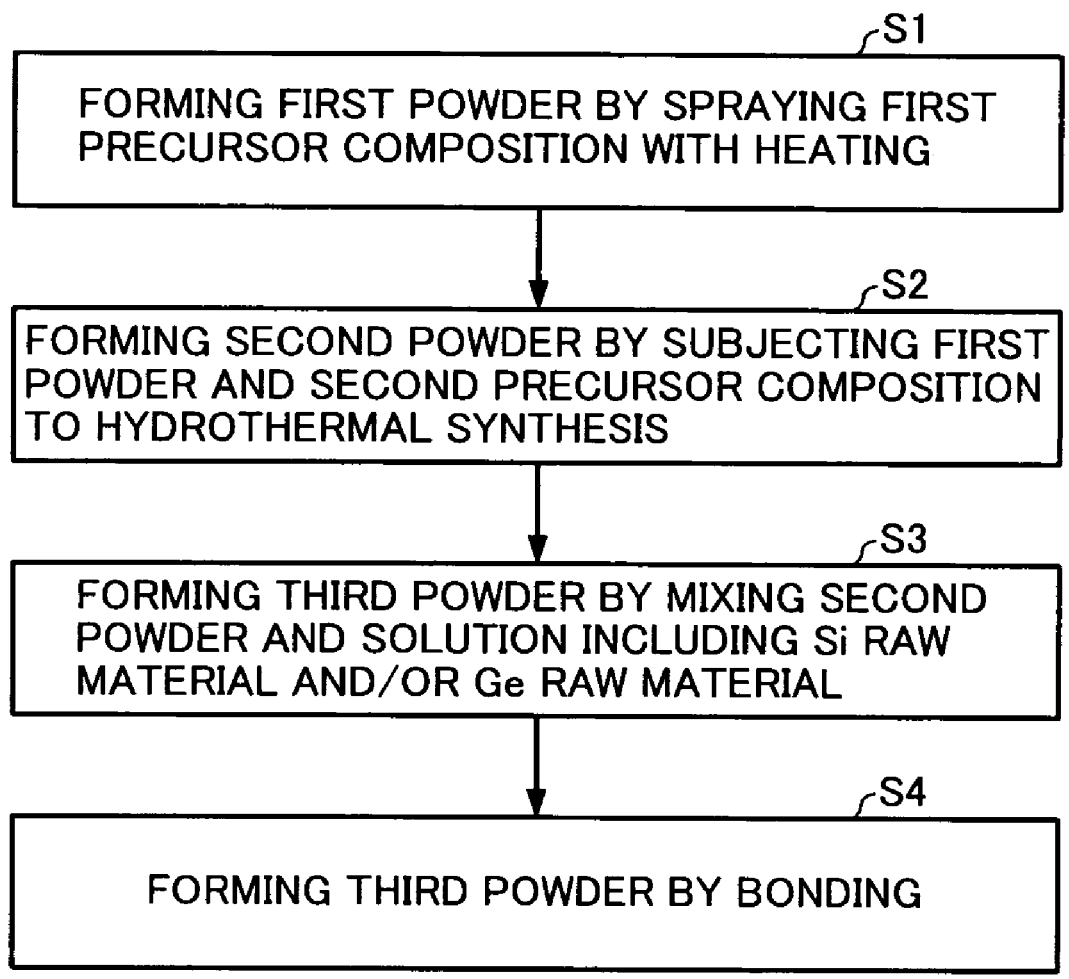
FIG. 1 is a flowchart showing a method of manufacturing an insulating target material according to one embodiment of the invention.

The invention may provide a manufacturing method which can produce an insulating target material at a temperature significantly lower than that of a related-art sintering method, and an insulating target material obtained by this method.

The invention may also provide an insulating complex oxide film formed by using the above insulating target material.

The invention may further provide a device including the above insulating complex oxide film.

According to one embodiment of the invention, there is provided an insulating target material for obtaining an insulating complex oxide film represented by a general formula $AB_{1-x}C_xO_3$, an element A including at least Pb, an element B including at least one of Zr, Ti, V, W, and Hf, and an element C including at least one of Nb and Ta.

The insulating target material according to this embodiment can be formed with low energy without requiring high-temperature sintering.

In this insulating target material, the element B may include Zr and Ti; and the element C may include Nb.

In this insulating target material, the insulating target material may include Nb in a range of $0.1 \leq x \leq 0.3$.

The insulating target material may further comprise at least one of Si and Ge in an amount of 0.5 mol % or more.

According to one embodiment of the invention, there is provided a method of manufacturing an insulating target material for obtaining an insulating complex oxide film represented by a general formula $AB_{1-x}C_xO_3$, an element A including at least Pb, an element B including at least one of Zr, Ti, V, W, and Hf, an element C including at least one of Nb and Ta, and the method comprising:

forming a first powder of an insulating complex oxide represented by the general formula $AB_{1-x}C_xO_3$; and subjecting the first powder and a first precursor composition including a precursor for forming an insulating complex oxide represented by the general formula $AB_{1-x}C_xO_3$ to hydrothermal synthesis to allow an insulating complex oxide to be grown around particles of the first powder to form a second powder.

The method according to this embodiment allows an insulating target material to be obtained with low energy without requiring high-temperature sintering by using hydrothermal synthesis.

In this method of manufacturing an insulating target material, the first precursor composition may include the precursor which includes at least the element B and the element C and has a partial ester bond.

In this method of manufacturing an insulating target material, the precursor may further include at least one of Si and Ge.

In this method of manufacturing an insulating target material, the first precursor composition may include the precursor dissolved in a basic solvent.

In this method of manufacturing an insulating target material, the first powder may be formed by spraying a second precursor composition with heating, the second precursor composition including a precursor which includes at least the element B and the element C and has a partial ester bond.

The method of manufacturing an insulating target material may further comprise:

mixing the second powder with a solution including at least one of an Si raw material and a Ge raw material, and collecting the second powder to obtain a third powder; and forming the third powder by bonding.

In this method of manufacturing an insulating target material, the solution may include at least one of the Si raw material and the Ge raw material in an amount of 2 to 10 mol %.

According to one embodiment of the invention, there is provided an insulating complex oxide film represented by a general formula $AB_{1-x}C_xO_3$, the insulating complex oxide film being formed by RF sputtering by using the above-described insulating target material and comprising at least one of Si and Ge.

According to one embodiment of the invention, there is provided a device comprising:

a base; and the above-described insulating complex oxide film formed above the base.

The device according to this embodiment refers to a device including the above-described insulating complex oxide film, and includes a part including the insulating complex oxide film and an electronic instrument including the part. Specific examples of the device are described later.

Embodiments of the invention are described below in detail.

1. Insulating Target Material

An insulating target material according to one embodiment of the invention is an insulating target material for obtaining an insulating complex oxide film of the general formula $AB_{1-x}C_xO_3$, the insulating target material including an element A, an element B, and an element C, wherein the element A may include at least Pb, the element B may include at least one of Zr, Ti, V, W, and Hf, and the element C may include at least one of Nb and Ta.

In the insulating complex oxide film (hereinafter may be called "complex oxide") of the general formula $AB_{1-x}C_xO_3$ according to this embodiment, the element A may include at least Pb, the element B may include Zr and Ti, and the element C may include Nb. In this case, the complex oxide may include Nb in the range of $0.1 \leq x \leq 0.3$. Specifically, the complex oxide according to this embodiment may be Pb(Zr,Ti,Nb)$O_3$ (PZTN) in which the Ti site is doped with Nb.

Nb has a size approximately equal to that of Ti (i.e. Nb and Ti have similar ionic radii and have the same atomic radius) and has an atomic weight twice the atomic weight of Ti. Therefore, Nb is not easily released from a lattice even if a collision occurs between atoms due to lattice vibration. Since Nb is stable at a valence of +5, the valence of Pb can be compensated for by $Nb^{5+}$ even if Pb is released. Moreover, even if Pb is released during crystallization, it is easier for small Nb to enter the lattice than large O to be released.

Since $Nb^{4+}$ also exists, Nb can replace $Ti^{4+}$. Moreover, since Nb has very strong covalent bonding properties, Nb is not easily released.

Since the complex oxide (particularly PZTN) obtained using the precursor composition according to this embodiment includes a specific amount of Nb, the ferroelectric exhibits excellent composition controllability due to the absence of an adverse effect caused by Pb deficiency. As a result, PZTN exhibits excellent hysteresis characteristics, leakage characteristics, reduction resistance, and insulating properties in comparison with PZT.

Nb has been doped into PZT mainly in the Zr-rich rhombohedral region. However, the amount of doping is as small as about 0.2 to 0.025 mol %. This is because the crystallization temperature is increased by adding a large amount of Nb (e.g. 800° C. or more when adding Nb in an amount of 10 mol %).

Figure 2:
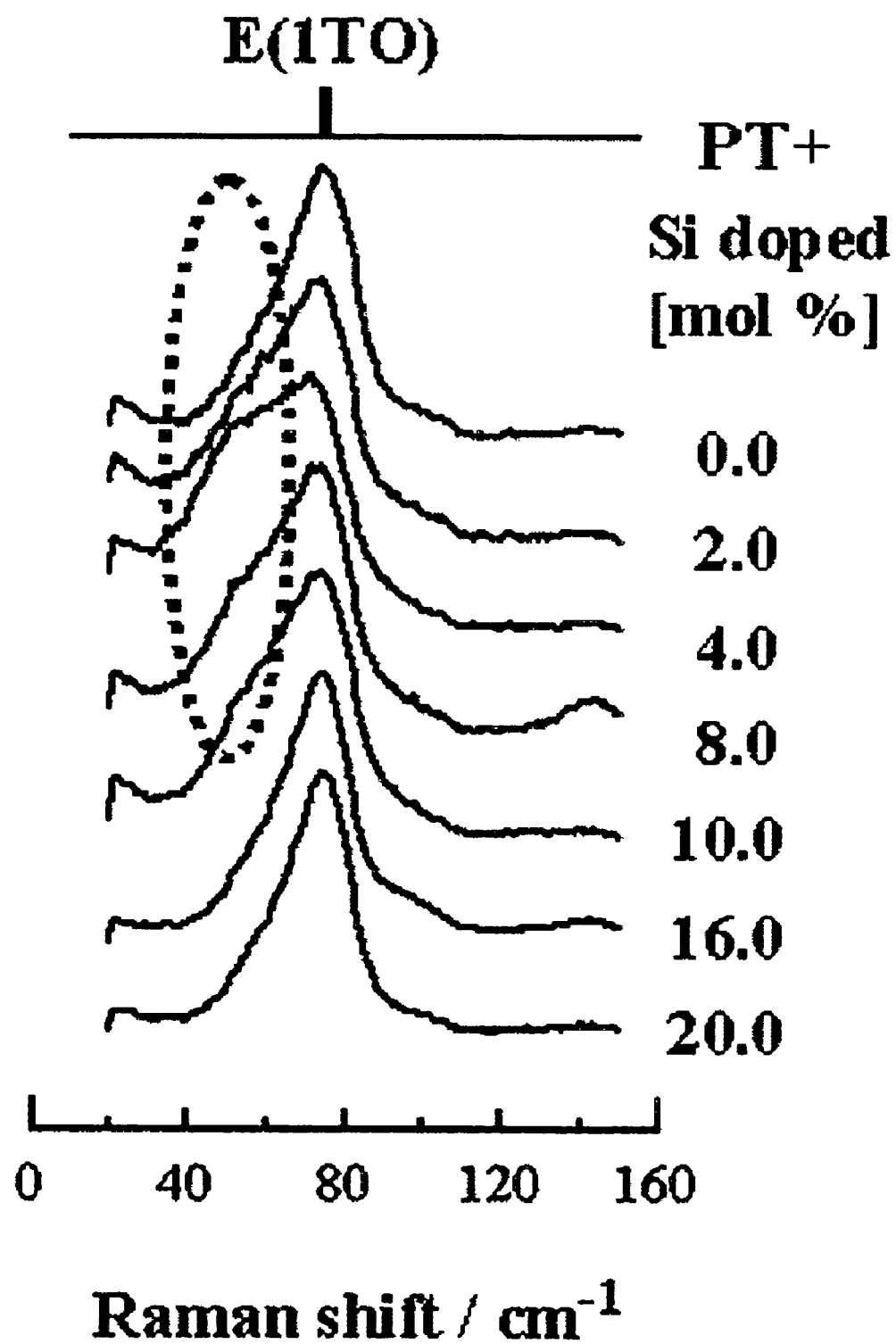
FIG. 2 shows a change in Raman vibration mode of an A-site ion when adding Si to lead titanate in one embodiment of the invention.

Therefore, it is preferable to add $PbSiO_3$ silicate to the precursor composition of the complex oxide in an amount of 0.5 to 10 mol %, for example. This reduces the crystallization energy of PZTN. Specifically, when using PZTN as the material for the complex oxide film, the crystallization temperature of PZTN can be reduced by adding $PbSiO_3$ (silicate) together with Nb. A silicate and a germanate may be used in combination. The inventors of the invention have confirmed that Si functions as a sintering agent and then forms part of the crystal as the A-site ion (see FIG. 2). Specifically, as shown in FIG. 2, when adding Si to lead titanate, a change in the Raman vibration mode E (1TO) of the A-site ion was observed. The change in the Raman vibration mode was observed when the amount of Si added was 8 mol % or less. Therefore, it was confirmed that Si exists in the A site of the perovskite when adding a small amount of Si.

In this embodiment, Ta may be used instead of Nb, or may be used together with Nb. Ta shows a tendency similar to that of Nb.

As described above, the insulating complex oxide film of the general formula $AB_{1-x}C_xO_3$ according to this embodiment may include preferably 0.5 mol % or more of at least one of Si and Ge, and still more preferably 0.5 to 10 mol % of Si or Si and Ge.

2. Method of Manufacturing Insulating Target Material

An insulating target material according to one embodiment of the invention may be formed by using the following method. This is a method of manufacturing the insulating target material to obtain an insulating complex oxide film of the general formula $AB_{1-x}C_xO_3$, the element A including at least Pb, the element B including at least one of Zr, Ti, V, W, and Hf, and the element C including at least one of Nb and Ta.

FIG. 1 shows the method of manufacturing the insulating target material according to this embodiment.

(1) Production of First Powder

A first powder of an insulating complex oxide of the general formula $AB_{1-x}C_xO_3$ is formed. The first powder is formed by spraying a precursor composition for obtaining an insulating complex oxide of the general formula $AB_{1-x}C_xO_3$ with heating (e.g. spray drying method) (step S1). The first powder may be formed while evaporating the solvent of the precursor composition by spraying the precursor composition with heating. The heating temperature is not particularly limited insofar as the solvent can be vaporized. For example, the heating temperature may be 80 to 120° C.

The first powder functions as nuclei when a complex oxide is epitaxially grown in the subsequent hydrothermal synthesis step. The first powder may have a particle diameter of 1 to 100 micrometers, for example, taking this function into consideration.

The precursor composition used in this step and the method of producing the precursor composition are described later in detail. The precursor composition used in this step may be the same as a precursor composition used in the subsequent hydrothermal synthesis step.

(2) Production of Second Powder

The first powder obtained in the step (1) and a precursor composition including a precursor for forming an insulating complex oxide of the general formula $AB_{1-x}C_xO_3$ are subjected to hydrothermal synthesis to allow an insulating complex oxide to be grown around the first powder particles to obtain a second powder (step S2).

The precursor composition used in this step and the method of producing the precursor composition are described later in detail. It is preferable that the precursor composition be alkaline (basic). Specifically, since a strong basic solution is used for hydrothermal synthesis, it is preferable that the precursor composition also exhibit basicity.

The solution used for hydrothermal synthesis exhibits strong basicity (e.g. pH 10 to 12). Therefore, a strong basic substance is mixed into the precursor composition. The strong basic substance is not particularly limited. For example, sodium hydroxide, potassium hydroxide, barium hydroxide, calcium hydroxide, or the like may be used. In hydrothermal synthesis, the solution temperature is set at 110 to 200° C., for example. The solution is allowed to stand in this state for a specific period of time (e.g. 24 to 72 hours) to obtain second particles in which an insulating complex oxide film of the general formula $AB_{1-x}C_xO_3$ is formed to cover the first particles of the first powder. The second particles of the complex oxide thus obtained are separated by filtration or the like to obtain the second powder.

(3) Production of Third Powder

The second powder obtained in the step (2) and a solution including at least one of an Si raw material and a Ge raw material (Si raw material and/or Ge raw material) are mixed. The second powder is collected by filtration or the like to form a third powder (step S3). The third powder contains the second powder and the Si raw material and/or the Ge raw material.

(4) Forming Target

The third powder obtained in the step (3) is placed in a die and formed by bonding into a desired shape to obtain an insulating target material (step S4). For example, the third powder may be placed in a die and formed by vacuum hot pressing. The third powder may be formed at 400 to 500° C. The insulating target material according to this embodiment may be thus obtained.

(5) Grinding Target

The resulting insulating target material may be ground on the surface by wet grinding, as required.

The manufacturing method according to this embodiment allows an excellent insulating target material to be obtained at a temperature significantly lower than that of a related-art sintering method by mixing the second powder and the solution of the Si raw material and/or the Ge raw material and forming the insulating complex oxide by hydrothermal synthesis, as is clear from the examples described later. According to this manufacturing method, an insulating target material can be obtained which produces a conductive complex oxide film exhibiting excellent crystal orientation and the like.

3. Precursor Composition and Method of Producing the Same

The precursor composition used to manufacture the insulating target material and the method of producing the precursor composition are described.

3.1. Precursor Composition

The precursor composition used in this embodiment is used to form the first powder and the second powder including the insulating complex oxide film. The insulating complex oxide film may be shown by the general formula $AB_{1-X}C_XO_3$. The element A may include at least Pb, the element B may include at least one of Zr, Ti, V, W, and Hf, and the element C may include at least one of Nb and Ta. In this embodiment, the precursor includes at least the element B and the element C and includes a partial ester bond.

In the precursor composition, the precursor may be dissolved or dispersed in an organic solvent. An alcohol may be used as the organic solvent. The alcohol is not particularly limited. As examples of the alcohol, monohydric alcohols such as butanol, methanol, ethanol, and propanol, polyhydric alcohols, and basic alcohols can be given.

Since the second powder is obtained by hydrothermal synthesis, it is preferable that the precursor composition used in this step exhibit basicity. Specifically, since a strong basic solution is used for hydrothermal synthesis, the pH of the solution can be easily adjusted by using a basic precursor composition. The solvent of the precursor composition used to produce the first powder is not particularly limited. A solvent similar to that of the precursor composition used to obtain the second powder may be used.

As examples of the alcohol, the following alcohols can be given.

Monohydric Alcohol:
Propanol (propyl alcohol): 1-propanol (boiling point: 97.4° C.) and 2-propanol (boiling point: 82.7° C.)
Butanol (butyl alcohol): 1-butanol (boiling point: 117° C.), 2-butanol (boiling point: 100° C.), 2-methyl-1-propanol (boiling point: 108° C.), and 2-methyl-2-propanol (melting point: 25.4° C., boiling point: 83° C.)
Pentanol (amyl alcohol): 1-pentanol (boiling point: 137° C.), 3-methyl-1-butanol (boiling point: 131° C.), 2-methyl-1-butanol (boiling point: 128° C.), 2,2-dimethyl-1-propanol (boiling point: 113° C.), 2-pentanol (boiling point: 119° C.), 3-methyl-2-butanol (boiling point: 112.5° C.), 3-pentanol (boiling point: 117° C.), and 2-methyl-2-butanol (boiling point: 102° C.)

Polyhydric Alcohol:
Ethylene glycol (melting point: −11.5° C., boiling point: 197.5° C.) and glycerol (melting point: 17° C., boiling point: 290° C.)

Basic Alcohol:
Dimethylaminoethanol, diethylaminoethanol, dimethylaminomethanol, and diethylaminomethanol In the precursor composition, since the precursor includes an ester bond formed by esterification of a polycarboxylic acid and a metal alkoxide to allow a reversible reaction, the polymerized precursor can be decomposed into the metal alkoxide, as described later in detail. Therefore, the resulting metal alkoxide can be recycled as the precursor raw material.

Moreover, this embodiment has the following advantages. A commercially available PZT sol-gel solution generally contains lead acetate as the lead raw material. Since lead acetate bonds to an alkoxide of Ti or Zr to only a small extent, lead is not easily incorporated into the precursor network. According to this embodiment, a first carboxyl group, which is one of the two carboxyl groups of succinic acid (dicarboxylic acid) initially functioning as an acid, has a pH of 4.0, which is lower than that of acetic acid (pH=4.56) (i.e. stronger than acetic acid). Therefore, lead acetate is bonded to succinic acid. Specifically, a reaction indicated by "salt of weak acid+ strong acid? salt of strong acid+weak acid" occurs. Since the remaining second carboxyl group of succinic acid is bonded to another MOD molecule or alkoxide, Pb can be easily incorporated into the precursor network.

3.2. Method of Producing Precursor Composition

A method of producing the precursor composition used in this embodiment includes mixing a sol-gel raw material including at least the element B and the element C and including a hydrolysis-condensation product of a metal alkoxide, a polycarboxylic acid or a polycarboxylic acid ester, and an organic solvent, and forming a precursor including an ester bond formed by esterification of the polycarboxylic acid or a polycarboxylic acid derived from the polycarboxylic acid ester and the metal alkoxide.

Figure 5:
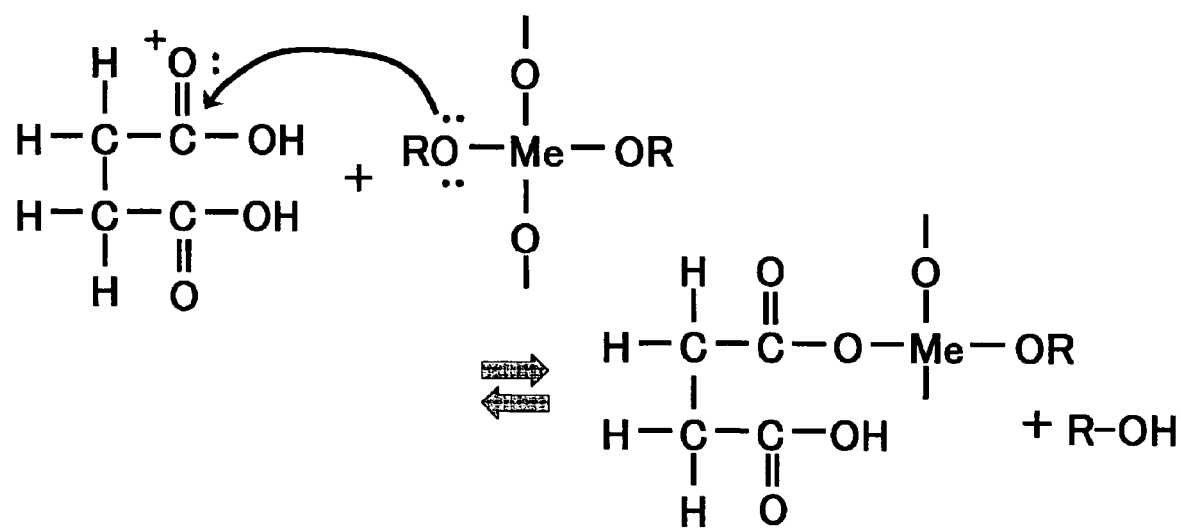
FIG. 5 shows a formation reaction of a precursor in a precursor composition according to one embodiment of the invention.
Figure 6:
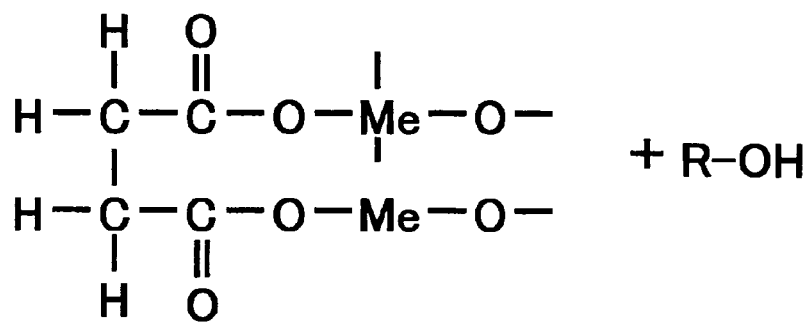
FIG. 6 shows a formation reaction of a precursor in a precursor composition according to one embodiment of the invention.

FIGS. 5 and 6 schematically illustrate the precursor formation reaction.

The precursor formation reaction is roughly divided into a first-stage alkoxyl group substitution reaction as shown in FIG. 5, and a second-stage polymer network formation reaction by esterification as shown in FIG. 6. FIGS. 5 and 6 illustrate an example when using dimethyl succinate as the polycarboxylic acid ester and n-butanol as the organic solvent. Although dimethyl succinate is nonpolar, dimethyl succinate dissociates in an alcohol to produce a dicarboxylic acid.

In the first-stage reaction, dimethyl succinate and the metal alkoxide of the sol-gel raw material undergo esterification and are bonded through an ester bond, as shown in FIG. 5. Specifically, dimethyl succinate dissociates in n-butanol so that one of the carbonyl groups (first carbonyl group) is protonated. A substitution reaction occurs between the first carbonyl group and the alkoxyl group of the metal alkoxide to produce a reaction product, in which the first carboxyl group is esterified, together with an alcohol. The term "ester bond" used herein means a bond (—COO—) formed by a carbonyl group and an oxygen atom. The first-stage and second-stage reactions similarly occur in another alcohol.

In the second-stage reaction, a substitution reaction occurs between the remaining carboxyl group (second carboxyl group) and the alkoxyl group of the metal alkoxide to produce a reaction product, in which the second carboxyl group is esterified, together with an alcohol, as shown in FIG. 6.

A polymer network, in which the hydrolysis-condensation products of the metal alkoxide included in the sol-gel raw material are bonded through ester bonds, is obtained by the above two-stage reaction. Therefore, the polymer network includes a moderate number of ester bond in the network. Since dimethyl succinate dissociates in two stages and the first carboxyl group has an acid dissociation constant greater than that of the second carboxyl group, the first-stage reaction has a rate of reaction higher than the rate of reaction of the second-stage reaction. Therefore, the second-stage reaction proceeds more slowly than the first-stage reaction.

In this embodiment, the following method may be used to promote the above esterification reaction.

(1) The concentration or reactivity of the reactant may be increased. In more detail, the reactivity is increased by increasing the degree of dissociation of the polycarboxylic acid or the polycarboxylic acid ester by increasing the temperature of the reaction system. It is preferable that the temperature of the reaction system be higher than room temperature and lower than the boiling point of the organic solvent, although the temperature of the reaction system varies depending on the boiling point of the organic solvent. The temperature of the reaction system may be 100° C. or less, and preferably 50 to 100° C., for example.

(2) A reaction by-product may be removed. In more detail, esterification is promoted by removing water and an alcohol produced during esterification.

(3) The molecular motion of the reactant may be physically accelerated. In more detail, the reactivity of the reactant is increased by applying energy rays such as ultraviolet rays.

The organic solvent used in the method of producing the precursor composition may be an alcohol, as described above. The sol-gel raw material and the polycarboxylic acid or the polycarboxylic acid ester can be efficiently dissolved by using an alcohol as the solvent.

In the method of producing the precursor composition, the polycarboxylic acid or the polycarboxylic acid ester may be a carboxylic acid or a carboxylic acid ester having two or more carboxyl groups. As examples of the polycarboxylic acid used in this embodiment, the following compounds can be given. As examples of a tricarboxylic acid, trans-aconitic acid, trimesic acid, and the like can be given. As examples of a tetracarboxylic acid, pyromellitic acid, 1,2,3,4-cyclopentanetetracarboxylic acid, and the like can be given. As examples of the polycarboxylic acid ester which dissociates in an alcohol to function as a polycarboxylic acid, dicarboxylic acid esters such as dimethyl succinate, diethyl succinate, dibutyl oxalate, dimethyl malonate, dimethyl adipate, dimethyl maleate, and diethyl fumarate, tricarboxylic acid esters such as tributyl citrate and triethyl 1,1,2-ethanetricarboxylate, tetracarboxylic acid esters such as tetraethyl 1,1,2,2-ethanetetracarboxylate and trimethyl 1,2,4-benzenetricarboxylate, and the like can be given. The above polycarboxylic acid ester dissociates in the presence of an alcohol to function as a polycarboxylic acid. FIGS. 4A to 4D illustrate examples of the above-mentioned polycarboxylic acids and polycarboxylic acid esters. This embodiment is characterized in that the network is grown by esterification using the polycarboxylic acid. Since the ester network is not grown when using a monocarboxylic acid or a monocarboxylic acid ester, such as acetic acid or methyl acetate, a monocarboxylic acid or a monocarboxylic acid ester is not used in this embodiment.

In the method of producing the precursor composition, the dicarboxylic acid ester is preferably at least one compound selected from a succinic acid ester, a maleic acid ester, and a malonic acid ester. As specific examples of these esters, dimethyl succinate, dimethyl maleate, and dimethyl malonate can be given.

The polycarboxylic acid ester may have a molecular weight of 150 or less. If the molecular weight of the polycarboxylic acid ester is too great, the resulting film may be damaged when the ester volatilizes during heat treatment, whereby a dense film may not be obtained.

The polycarboxylic acid ester may be liquid at room temperature. If the polycarboxylic acid ester is solid at room temperature, gelation may occur.

The amount of polycarboxylic acid or polycarboxylic acid ester used is adjusted depending on the compositional ratio of the sol-gel raw material and the insulating complex oxide film. The ratio of the total molar ion concentration of the PZT sol-gel raw material, PbNb sol-gel raw material, and PbSi sol-gel raw material, to which the polycarboxylic acid is bonded, to the molar ion concentration of the polycarboxylic acid is set at preferably "1≧(molar ion concentration of polycarboxylic acid)/(total molar ion concentration of raw material solution)", and still more preferably 1:1. The polycarboxylic acid may be added in an amount of 0.35 mol, for example.

It is preferable that the amount of polycarboxylic acid or polycarboxylic acid ester added be equal to or greater than the total number of moles of the raw material solution. All the raw materials are bonded when the molar ion concentration ratio is 1:1. However, since an ester stably exists in an acidic solution, it is preferable to add the polycarboxylic acid in excess to the total number of moles of the raw material solution in order to allow an ester to stably exist. The number of moles of the polycarboxylic acid or the polycarboxylic acid ester used herein refers to the number of carboxyl groups. Specifically, when using a dicarboxylic acid or a dicarboxylic acid ester, one dicarboxylic acid or dicarboxylic acid ester molecule can be bonded to two raw material molecules. Therefore, the ratio is 1:1 when the amount of dicarboxylic acid or dicarboxylic acid ester is 0.5 mol for one mol of the raw material solution. The polycarboxylic acid ester does not initially function as an acid. The polycarboxylic acid ester produces a polycarboxylic acid when caused to dissociate in an alcohol. In this case, it is preferable that the number of moles of alcohol added be "1≧(number of moles of alcohol/number of moles of polycarboxylic acid ester)". This is because the polycarboxylic acid ester more sufficiently and stably dissociates as the number of moles of alcohol is greater. The number of moles of alcohol used herein refers to a molar ion concentration obtained by dividing the number of moles by the number of hydroxyl groups.

In the method of producing the precursor composition, a raw material including a metal carboxylate may be additionally used. As examples of the metal carboxylate, the above-mentioned lead carboxylate such as lead acetate and lead octylate can be given.

Figure 3:
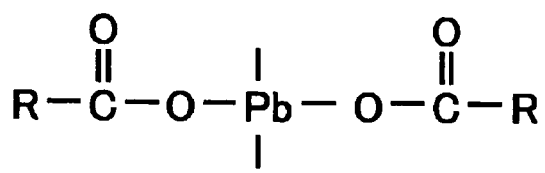
FIG. 3 is a view showing lead-containing carboxylic acids used in one embodiment of the invention.
Figure 3:
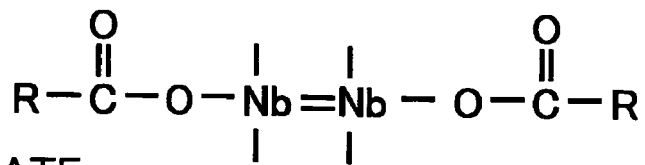
Figure 3:
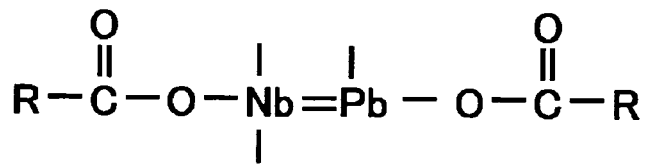
Figure 4A:
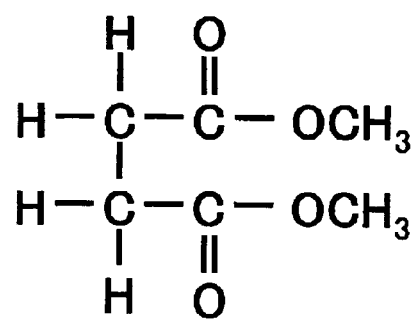
FIG. 4A shows polycarboxylic acids and polycarboxylic acid esters used in one embodiment of the invention.
Figure 4A:
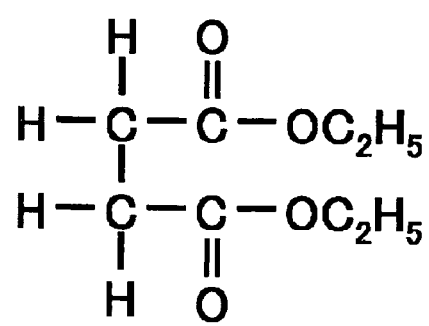
Figure 4B:
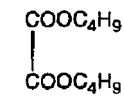
FIG. 4B shows polycarboxylic acids and polycarboxylic acid esters used in one embodiment of the invention.
Figure 4B:
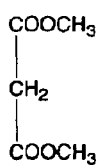
Figure 4B:
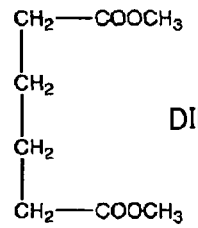
Figure 4B:
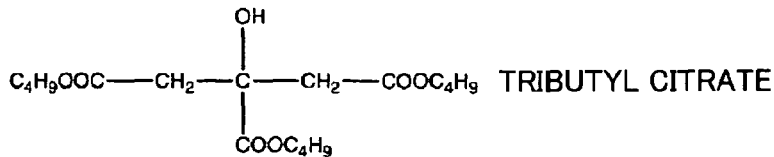
Figure 4B:
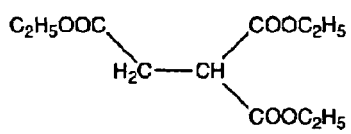
Figure 4B:
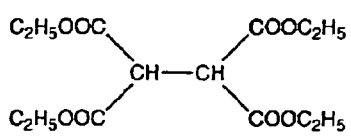
Figure 4C:
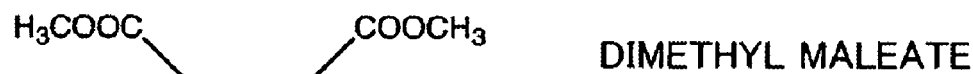
FIG. 4C shows polycarboxylic acids and polycarboxylic acid esters used in one embodiment of the invention.
Figure 4C:
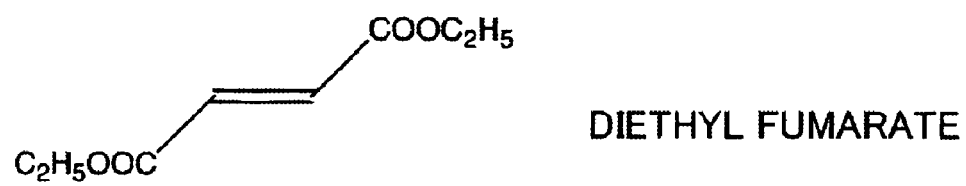
Figure 4C:
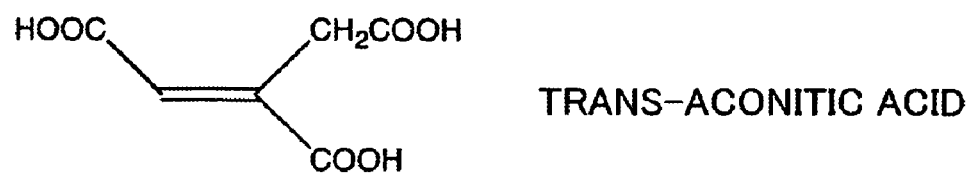
Figure 4D:
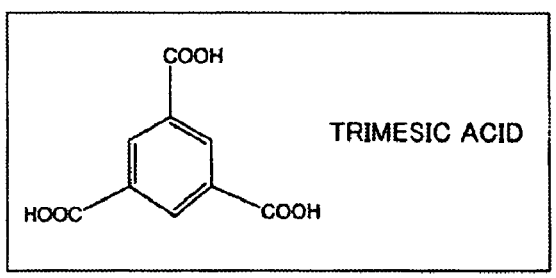
FIG. 4D shows polycarboxylic acids and polycarboxylic acid esters used in one embodiment of the invention.
Figure 4D:
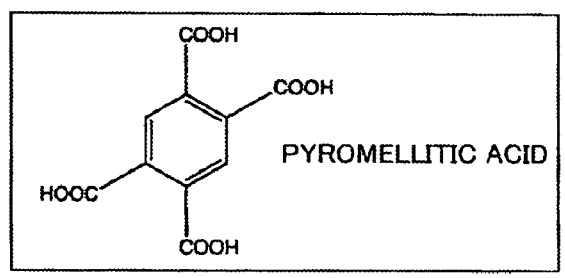
Figure 4D:
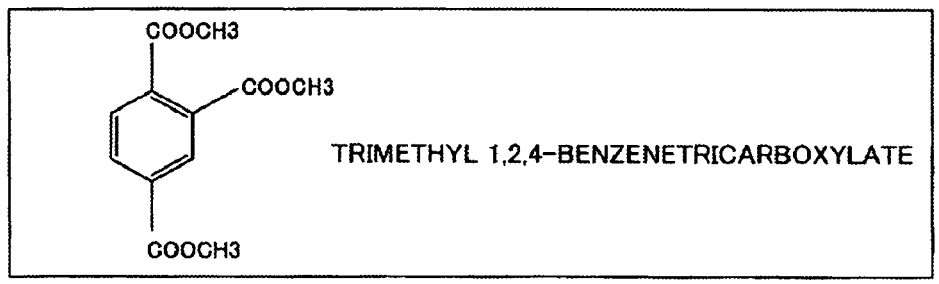
Figure 4D:
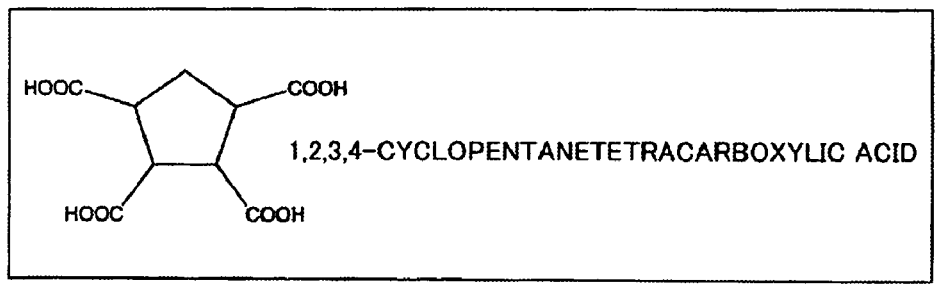

In the method of producing the precursor composition, an organometallic compound (MOD raw material) may be used together with the sol-gel raw material. As the organometallic compound, niobium octylate or the like may be used. As shown in the FIG. 3, niobium octylate has a structure in which two Nb atoms form a covalent bond and an octyl group exists in the remaining site. In this case, since a network other than the two Nb atoms does not exist, niobium octylate is regarded as the MOD raw material.

A network is formed between the carboxylic acid and the MOD raw material mainly through an alcohol exchange reaction. When using niobium octylate, a reaction occurs between the carboxylic acid and the octyl group (alcohol exchange reaction), whereby esterification (R—COO—Nb) proceeds. According to this embodiment, the molecules of the MOD raw material can be bonded to the precursor network through condensation between the MOD raw material and the alkoxide by esterifying the MOD raw material, as described above.

In the method of producing the precursor composition according to this embodiment, a sol-gel raw material including Si or Si and Ge may be used as the sol-gel raw material including the hydrolysis-condensation product of the metal alkoxide. As such a sol-gel solution, a $PbSiO_3$ sol-gel solution may be individually used, or a $PbSiO_3$ sol-gel solution and a $PbGeO_3$ sol-gel solution may be used in combination. The crystallization temperature can be reduced by using the sol-gel raw material including Si or Ge.

In the method of producing the precursor composition according to this embodiment, PZTN may be obtained by using a solution prepared by mixing at least a $PbZrO_3$ sol-gel solution, a $PbTiO_3$ sol-gel solution, and a $PbNbO_3$ sol-gel solution as the sol-gel solution. In this case, the above-mentioned sol-gel raw material including Si or Si and Ge may also be mixed.

When introducing Ta instead of Nb, a $PbTaO_3$ sol-gel solution may be used as the sol-gel raw material.

Since the precursor of the precursor composition obtained according to this embodiment includes a moderate number of ester bonds between the molecular networks, a reversible reaction can occur. Therefore, the polymerized precursor (polymer network) can be decomposed into the metal alkoxide condensate by causing the reaction shown in FIG. 5 to occur in the left direction.

The method of producing the precursor composition and the precursor composition used in this embodiment have the following features.

According to the method of producing the precursor composition, a polymer network in which the hydrolysis-condensation products (molecular networks) of the metal alkoxide of the sol-gel raw material are bonded through ester bonds is obtained in the organic solvent by using the polycarboxylic acid. Therefore, the polymer network includes a moderate number of ester bonds between the molecular networks derived from the above hydrolysis-condensation products. The esterification reaction can be easily carried out by controlling the temperature and the like.

Since the precursor composition includes a moderate number of ester bonds between the molecular networks, a reversible reaction can occur. Therefore, the polymerized precursor (polymer network) can be decomposed into the metal alkoxide (or molecular network of its condensation product) in the composition remaining after forming the insulating complex oxide film. Since the metal alkoxide (or molecular network of its condensation product) can be recycled as the precursor raw material, a toxic substance such as lead can be recycled. Therefore, it is advantageous from the viewpoint of environmental protection.

4. Insulating Complex Oxide Film

An insulating complex oxide film of the general formula $AB_{1-x}C_xO_3$ may be obtained by RF sputtering using the insulating target material according to one embodiment of the invention. The insulating complex oxide film includes at least one of Si and Ge, and preferably at least Si. The insulating complex oxide film of the general formula $AB_{1-x}C_xO_3$ may include at least one of Si and Ge in an amount of 2 to 10 mol %.

In RF sputtering, argon and oxygen may be used as the sputtering gas. The insulating complex oxide film according to this embodiment exhibits excellent crystal orientation and excellent characteristics.

5. Example

An example according to the invention is described below. Note that the invention is not limited to the following examples.

5.1. Example 1

An insulating target material according to Example 1 was obtained as follows. In Example 1, a PZTN target was formed.

(1) Production of First Powder

A first powder of PZTN was formed. The first powder was formed by using a precursor composition for obtaining PZTN in a spray drier device (manufactured by BÜCHI). The first powder was formed in the spray drier while heating the precursor composition at 200° C. The resulting first powder had a particle diameter of about 10 to 100 micrometers.

The precursor composition used in this step was obtained as follows.

In this example, the precursor composition for forming a PZTN film was obtained by mixing first to third raw material solutions, each containing at least one of Pb, Zr, Ti, and Nb, dimethyl succinate (polycarboxylic acid ester), and dimethylaminoethanol (organic solvent). The mixed solution was prepared by dissolving the sol-gel raw material and dimethyl succinate in dimethylaminoethanol at a ratio of 1:1.

As the first raw material solution, a solution was used in which a polycondensation product for forming a $PbZrO_3$ perovskite crystal containing Pb and Zr was dissolved in dimethylaminoethanol in an anhydrous state.

As the second raw material solution, a solution was used in which a polycondensation product for forming a $PbTiO_3$ perovskite crystal containing Pb and Ti was dissolved in dimethylaminoethanol in an anhydrous state.

As the third raw material solution, a solution was used in which a polycondensation product for forming a $PbNbO_3$ perovskite crystal containing Pb and Nb was dissolved in dimethylaminoethanol in an anhydrous state.

When forming a $PbZr_{0.2}Ti_{0.6}Nb_{0.2}O_3$ (PZTN) complex oxide film using the first, second, and third raw material solutions, the raw material solutions are mixed at a ratio of "(first raw material solution):(second raw material solution):(third raw material solution)=2:6:2". In order to reduce the crystallization temperature of the complex oxide film, a solution prepared by dissolving a polycondensation product for forming a $PbSiO_3$ crystal in dimethylaminoethanol in an anhydrous state was added as a fourth raw material solution in an amount of 3 mol % to obtain a precursor composition. The pH of the precursor composition was 8.0.

(2) Production of Second Powder

Barium hydroxide was mixed with the precursor composition for forming a PZTN complex oxide used in the step (1) to obtain a solution of which the pH was adjusted to 12.0. The first powder obtained in the step (1) was mixed into the solution. After airtightly enclosing the mixed solution, a PZTN complex oxide was grown around the first powder particles by hydrothermal synthesis to obtain a second powder. In hydrothermal synthesis, the solution temperature was set at 200° C. The components were reacted for 48 hours to obtain second particles. The second particles of the complex oxide thus obtained were filtered off to obtain a second powder.

(3) Production of Third Powder

The second powder obtained in the step (2) was mixed with a solution containing an Si alkoxide in an amount of 5 mol %. The second powder was then filtered off to form a third powder. The third powder contained the second powder and the Si alkoxide.

(4) Forming Target

The third powder obtained in the step (3) was placed in a die and formed by bonding into a desired shape to obtain an insulating target material. In more detail, the third powder was placed in a die and formed by vacuum hot pressing. The third powder was formed at 400 to 500° C. An insulating target material of Example 1 was thus obtained.

An insulating complex oxide film (PZTN film) with a thickness of 80 nm was formed on a base by RF sputtering using the insulating target material of Example 1. As the base, a base formed by stacking a $ZrO_2$ film, a $TiO_x$ film, a Pt film, and an $LaNiO_3$ film on a silicon substrate in that order was used. The RF sputtering was performed at a base temperature of 500° C., a power of 1.4 kW, a base-target distance of 70 mm, and an $Ar/O_2$ gas ratio of 5/1 to 10/1.

Figure 7:
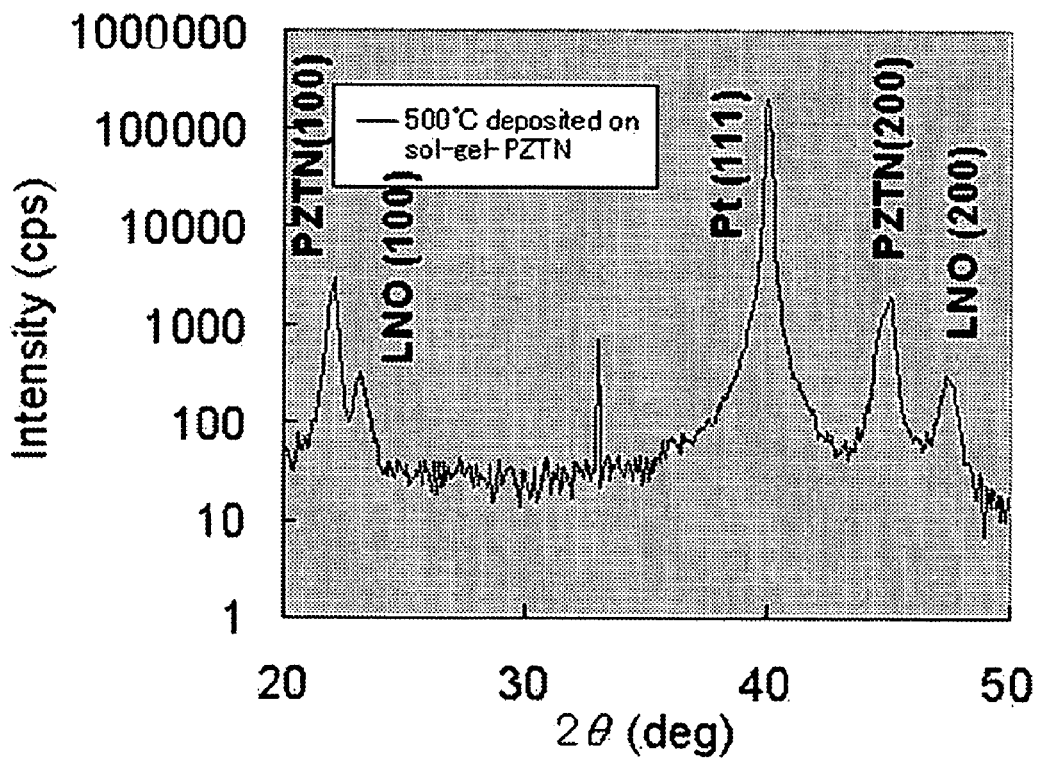
FIG. 7 shows X-ray analysis results of an insulating complex oxide film of Example 1.
Figure 8:
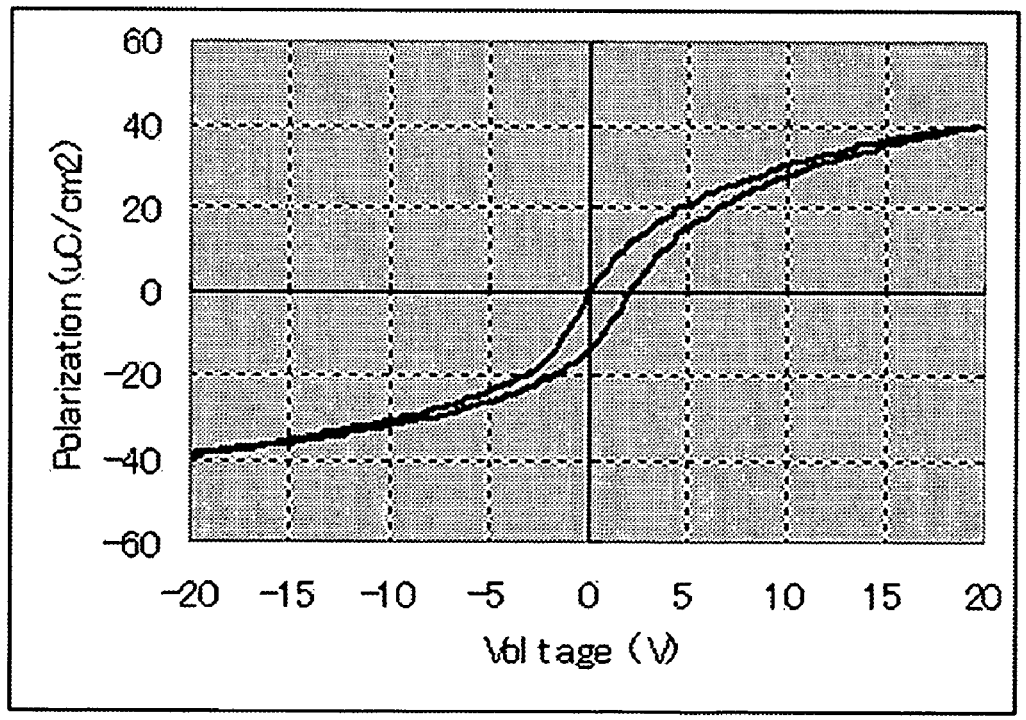
FIG. 8 shows hysteresis characteristics of Example 1.

The PZTN film of Example 1 was subjected to X-ray analysis. The results are shown in FIG. 7. A Pt film was formed on the PZTN film of Example 1, and the hysteresis of the resulting product was measured. The results are shown in FIG. 8.

As shown in Table 1, it was confirmed that the PZTN film of Example 1 had a (100) single orientation. As shown in FIG. 8, it was confirmed that the PZTN film of Example 1 had a ferroelectric hysteresis. The PZTN film was epitaxially grown with a (100) orientation due to the orientation of the LaNiO$_3$ film.

6. Device

A device according to one embodiment of the invention includes a base and the above-described insulating complex oxide film formed above the base. The device includes a part including the above-described insulating complex oxide and an electronic instrument including the part. Examples of the device are given below.

6.1. Semiconductor Device

A semiconductor device including the insulating complex oxide film is described below. This embodiment illustrates an example of a ferroelectric memory device including a ferroelectric capacitor which is an example of the semiconductor device.

Figure 9A:
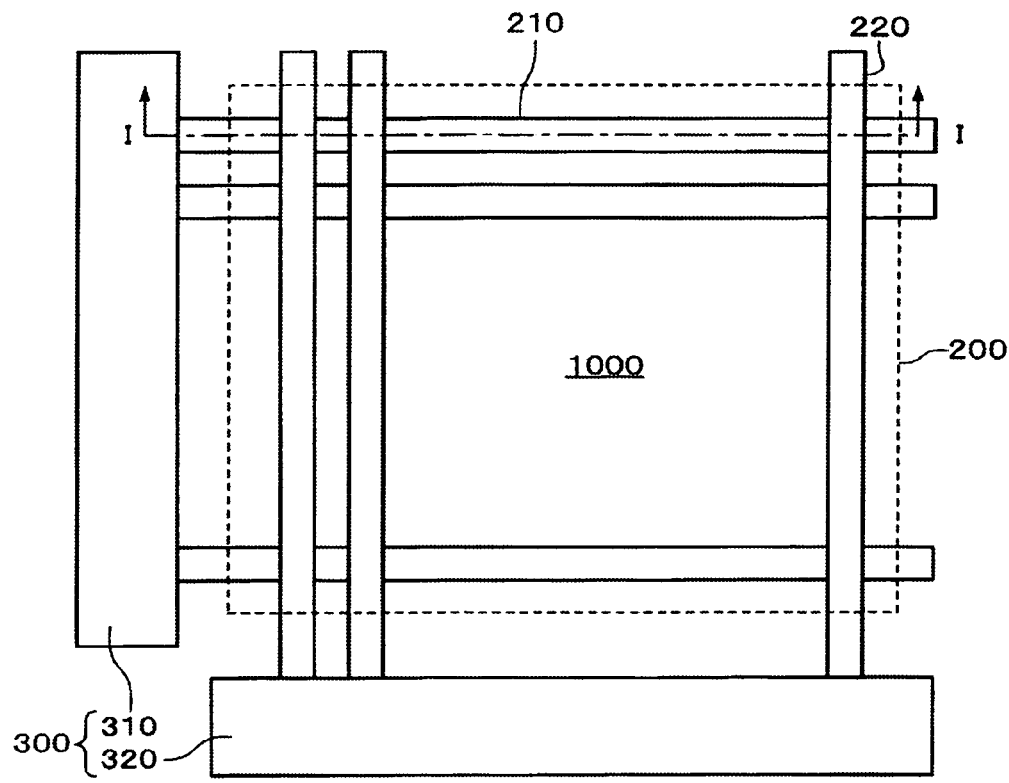
FIGS. 9A and 9B show a semiconductor device according to one embodiment of the invention.
Figure 9B:
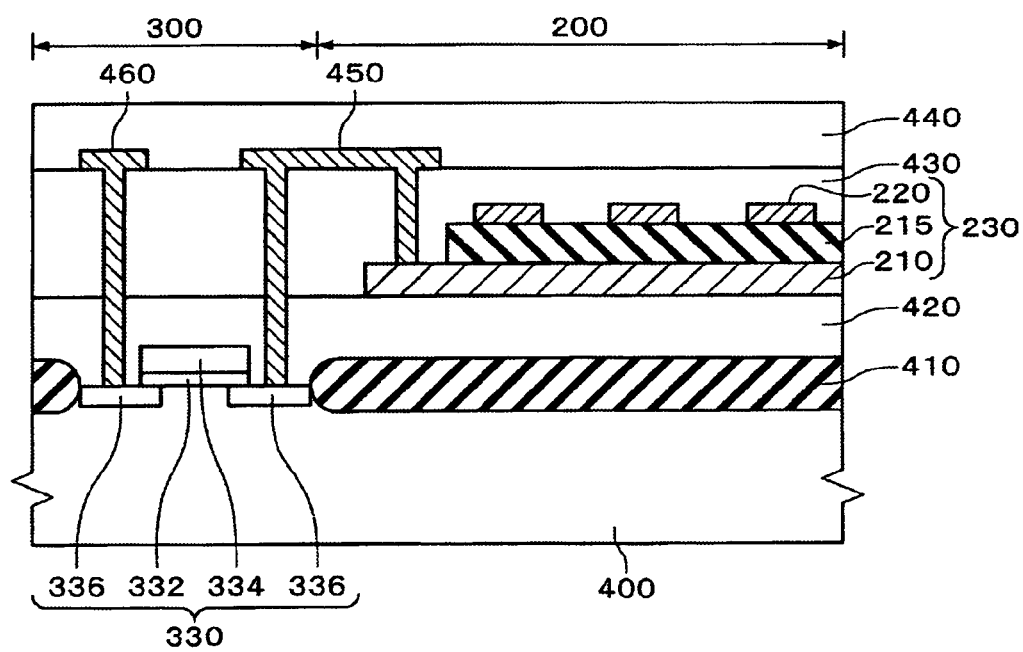

FIGS. 9A and 9B are views schematically showing a ferroelectric memory device 1000 in which the insulating complex oxide film is used as a ferroelectric film. FIG. 9A shows the planar shape of the ferroelectric memory device 1000, and FIG. 9B shows the cross section along the line I-I in FIG. 9A.

As shown in FIG. 9A, the ferroelectric memory device 1000 includes a memory cell array 200 and a peripheral circuit section 300. The memory cell array 200 and the peripheral circuit section 300 are formed in different layers. The peripheral circuit section 300 is disposed on a semiconductor substrate 400 in a region differing from the memory cell array 200. As specific examples of the peripheral circuit section 300, a Y gate, sense amplifier, input/output buffer, X address decoder, Y address decoder, or address buffer can be given.

In the memory cell array 200, row-selection lower electrodes 210 (wordlines) and column-selection upper electrodes 220 (bitlines) are arranged to intersect. The lower electrodes 210 and the upper electrodes 220 are formed in the shape of stripes formed of linear signal electrodes. The signal electrodes may be formed so that the lower electrode 210 serves as the bitline and the upper electrode 220 serves as the wordline.

As shown in FIG. 9B, a ferroelectric film 215 is disposed between the lower electrodes 210 and the upper electrodes 220. In the memory cell array 200, a memory cell which functions as a ferroelectric capacitor 230 is formed in the region in which the lower electrode 210 intersects the upper electrode 220. The ferroelectric film 215 is formed by using the insulating complex oxide film. The ferroelectric film 215 may be disposed between the lower electrode 210 and the upper electrode 220 at least in the region in which the lower electrode 210 intersects the upper electrode 220.

In the ferroelectric memory device 1000, a second interlayer dielectric 430 is formed to cover the lower electrode 210, the ferroelectric film 215, and the upper electrode 220. An insulating protective layer 440 is formed on the second interlayer dielectric 430 to cover interconnect layers 450 and 460.

As shown in FIG. 9A, the peripheral circuit section 300 includes various circuits for selectively writing or reading information into or from the memory cell array 200. For example, the peripheral circuit section 300 includes a first driver circuit 310 for selectively controlling the lower electrode 210, a second driver circuit 320 for selectively controlling the upper electrode 220, and a signal detection circuit (not shown) such as a sense amplifier.

As shown in FIG. 9B, the peripheral circuit section 300 includes a MOS transistor 330 formed on the semiconductor substrate 400. The MOS transistor 330 includes a gate insulating film 332, a gate electrode 334, and source/drain regions 336. The MOS transistors 330 are isolated by an element isolation region 410. The first interlayer dielectric 420 is formed on the semiconductor substrate 400 on which the MOS transistor 330 is formed. The peripheral circuit section 300 is electrically connected with the memory cell array 200 through an interconnect layer 51.

An example of write and read operations of the ferroelectric memory device 1000 is described below.

In the read operation, a read voltage is applied to the capacitor in the selected memory cell. This also serves as the write operation of "0". At this time, a current flowing through the selected bitline or a potential when causing the bitline to be in a high impedance state is read by using a sense amplifier. A specific voltage is applied to the capacitors of the unselected memory cells in order to prevent crosstalk during reading.

In the write operation of "1", a write voltage which causes a polarization reversal is applied to the capacitor in the selected memory cell. In the write operation of "0", a write voltage which does not cause a polarization reversal is applied to the capacitor in the selected memory cell to hold the "0" state written during the read operation. A specific voltage is applied to the capacitors in the unselected memory cells in order to prevent crosstalk during writing.

In the ferroelectric memory device 1000, the ferroelectric capacitor 230 includes the ferroelectric film 215 which can be crystallized at a low temperature. Therefore, the ferroelectric memory device 1000 can be manufactured without causing deterioration of the MOS transistor 330 making up the peripheral circuit section 300 and the like. Since the ferroelectric capacitor 230 has excellent hysteresis characteristics, a highly reliable ferroelectric memory device 1000 can be provided.

Figure 10:
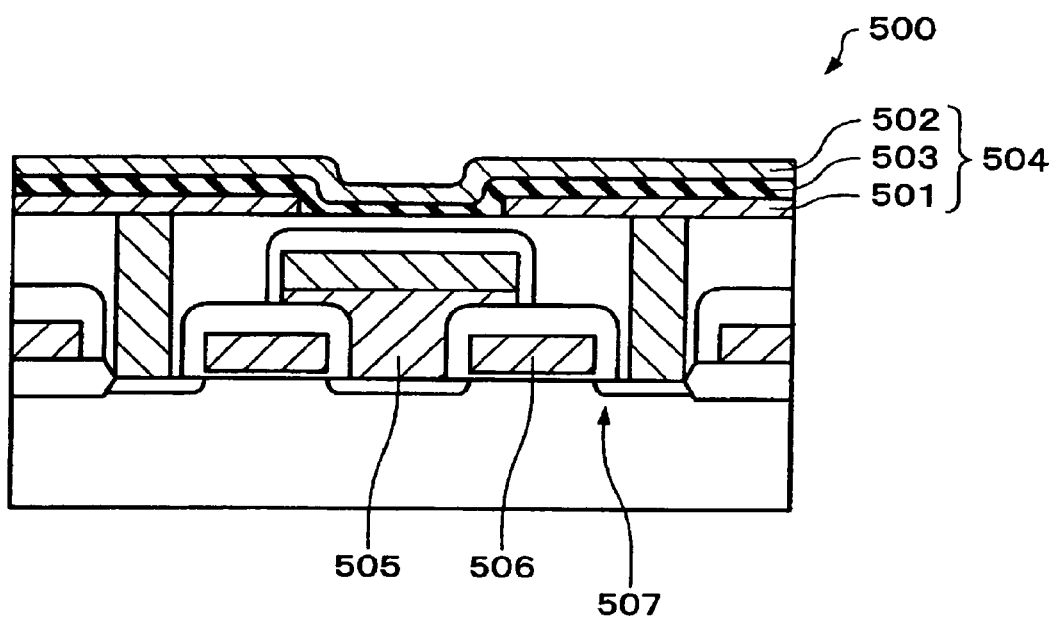
FIG. 10 is a cross-sectional view schematically showing a 1T1C ferroelectric memory according to one embodiment of the invention.
Figure 11:
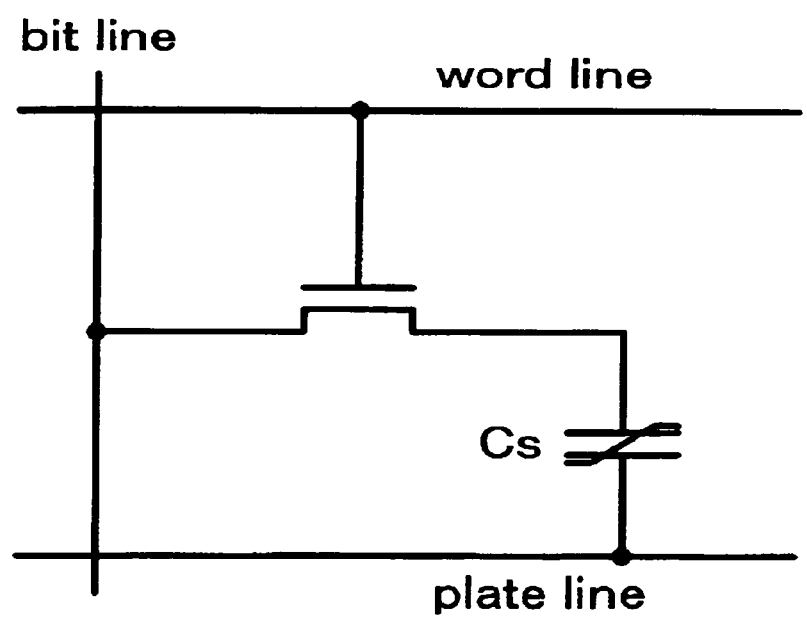
FIG. 11 shows an equivalent circuit of the ferroelectric memory shown in FIG. 10.

FIG. 10 is a structural view of a 1T1C ferroelectric memory device 500 as another example of a semiconductor device. FIG. 11 is an equivalent circuit diagram of the ferroelectric memory device 500.

As shown in FIG. 10, the ferroelectric memory device 500 is a memory device having a structure similar to that of a DRAM, and includes a capacitor 504 (1C) including a lower electrode 501, an upper electrode 502 connected with a plate line, and a ferroelectric film 503 according to the above-described embodiment, and a switch transistor element 507 (1T) including source/drain electrodes, one of which is connected with a data line 505, and a gate electrode 506 connected with a wordline. In the 1T1C memory, data can be written and read at a speed as high as 100 ns or less, and the written data does not volatilize. Therefore, the 1T1C memory is a promising memory which may replace an SRAM or the like.

Since the semiconductor device according to this embodiment is formed by using the raw material solution according to the above embodiment, the semiconductor film can be crystallized at a low temperature. Therefore, the semiconductor device can be embedded with another semiconductor device such as a MOS transistor. The semiconductor device according to this embodiment is not limited to the above-described semiconductor devices. The semiconductor device according to this embodiment may also be applied to a 2T2C ferroelectric memory device and the like.

6.2. Piezoelectric Device

An example in which the insulating complex oxide film is applied to a piezoelectric device is described below.

Figure 12:
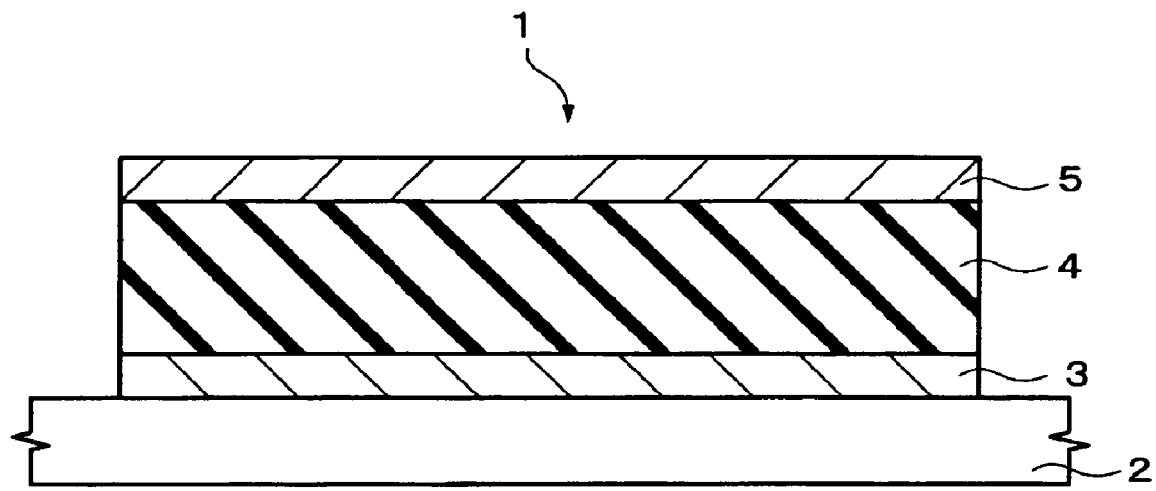
FIG. 12 is a cross-sectional view schematically showing a piezoelectric device according to an application example of one embodiment of the invention.

FIG. 12 is a cross-sectional view showing a piezoelectric device 1 including the insulating complex oxide film. The piezoelectric device 1 includes a substrate 2, a lower electrode 3 formed on the substrate 2, a piezoelectric film 4 formed on the lower electrode 3, and an upper electrode 5 formed on the piezoelectric film 4. The piezoelectric film 4 is formed by using the insulating complex oxide film.

As the substrate 2, a silicon substrate may be used. In this embodiment, a (110)-oriented single crystal silicon substrate is used as the substrate 2. A (100)-oriented single crystal silicon substrate or a (111)-oriented single crystal silicon substrate may also be used as the substrate 2. In addition, a substrate obtained by forming an amorphous silicon oxide film such as a thermal oxide film or a natural oxide film on the surface of a silicon substrate may also be used as the substrate 2. The substrate 2 is processed to form ink cavities 521 in an inkjet recording head 50 as described later (see FIG. 13).

The lower electrode 3 is an electrode for applying a voltage to the piezoelectric film 4. The lower electrode 3 may be formed to have the same planar shape as the piezoelectric film 4, for example. When two or more piezoelectric devices 1 are formed in the inkjet recording head 50 described later (see FIG. 13), the lower electrode 3 may be formed to function as a common electrode for the piezoelectric devices 1. The lower electrode 3 is formed to have a thickness of about 100 to 200 nm, for example.

The piezoelectric film 4 may have a perovskite structure.

6.3. Inkjet Recording Head and Inkjet Printer

Figure 13:
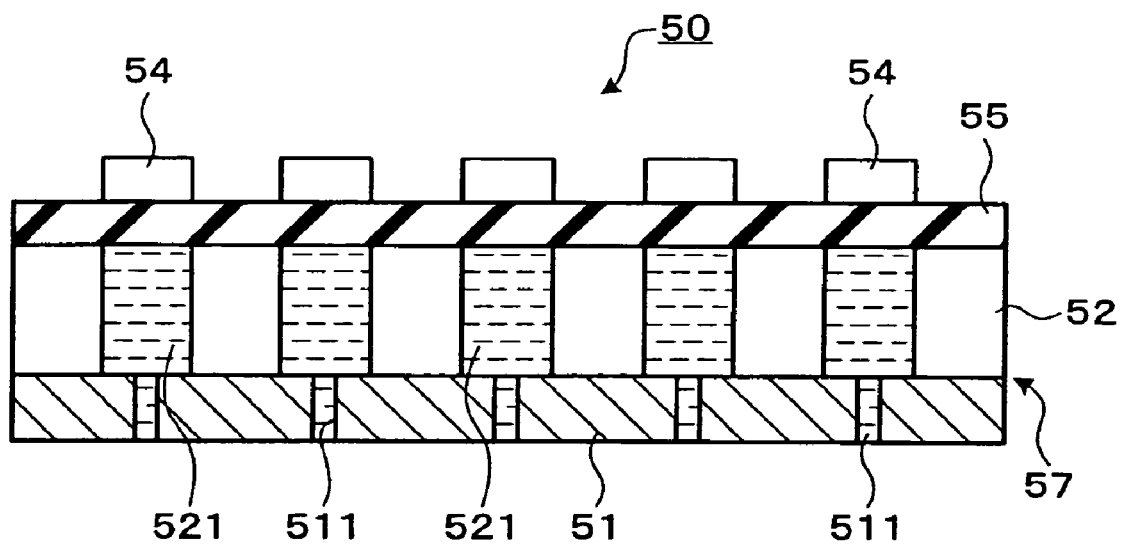
FIG. 13 is a schematic configurational view of an inkjet recording head according to an application example of one embodiment of the invention.
Figure 14:
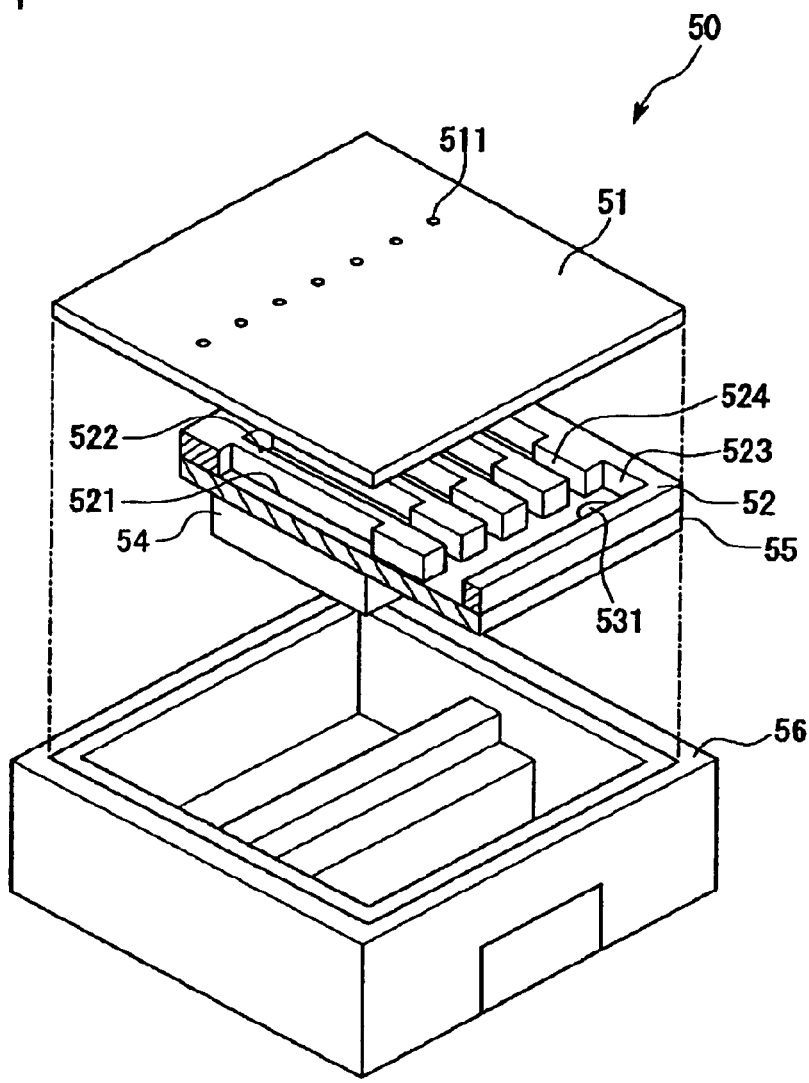
FIG. 14 is an exploded perspective view of an inkjet recording head according to an application example of one embodiment of the invention.
Figure 15:
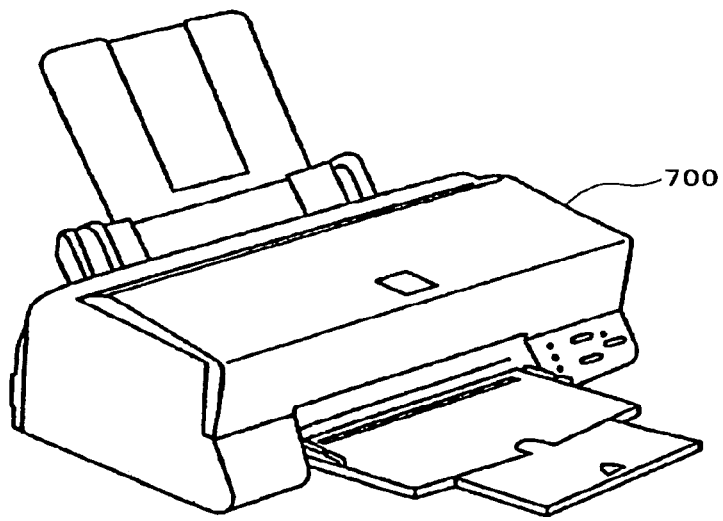
FIG. 15 is a schematic configurational view of an inkjet printer according to an application example of one embodiment of the invention.

An inkjet recording head in which the above-described piezoelectric device functions as a piezoelectric actuator, and an inkjet printer including the inkjet recording head are described below. The inkjet recording head and the inkjet printer are described below in this order. FIG. 13 is a side cross-sectional view showing a schematic configuration of the inkjet recording head according to this embodiment, and FIG. 14 is an exploded perspective view of the inkjet recording head which is reversed in the vertical direction. FIG. 15 shows an inkjet printer 700 including the inkjet recording head according to this embodiment.

6.3.1. Inkjet Recording Head

Figure 21:
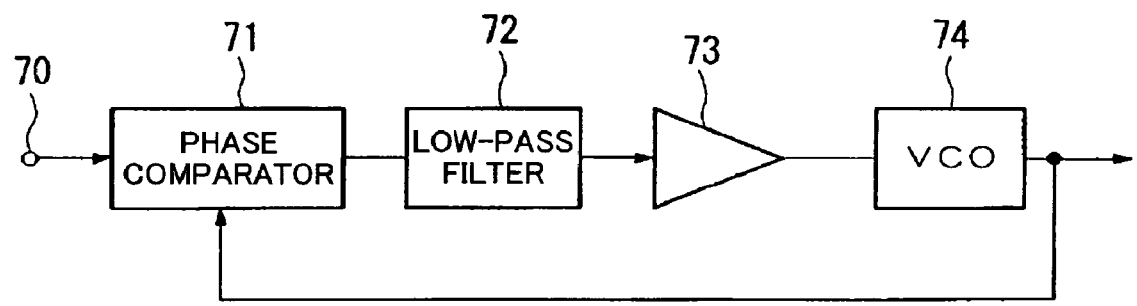
FIG. 21 is a block diagram showing the basic configuration of a PLL circuit according to an application example of one embodiment of the invention.

As shown in FIG. 13, the inkjet recording head 50 includes a head body (base) 57 and a piezoelectric section 54 formed over the head body 57. The piezoelectric device 1 shown in FIG. 21 is provided in the piezoelectric section 54. The piezoelectric device 1 is formed by stacking the lower electrode 3, the piezoelectric film (ferroelectric film) 4, and the upper electrode 5 in that order. The piezoelectric film 4 is a film formed by using the insulating complex oxide film. In the inkjet recording head, the piezoelectric section 54 functions as a piezoelectric actuator.

The inkjet recording head 50 includes a nozzle plate 51, an ink chamber substrate 52, an elastic film 55, and the piezoelectric section 54 bonded to the elastic film 55. These components are accommodated in a housing 56. The inkjet recording head 50 forms an on-demand type piezo jet head.

The nozzle plate 51 is formed of a stainless steel rolled plate or the like, in which a number of nozzles 511 for discharging ink droplets are formed in a row. The pitch between the nozzles 511 is appropriately determined depending on the printing precision.

The ink chamber substrate 52 is attached to (secured on) the nozzle plate 51. In the ink chamber substrate 52, cavities (ink cavities) 521, a reservoir 523, and supply ports 524 are partitioned by the nozzle plate 51, a side wall (partition wall) 522, and the elastic film 55. The reservoir 523 temporarily stores ink supplied from an ink cartridge (not shown). The ink is supplied to each cavity 521 from the reservoir 523 through the supply ports 524.

As shown in FIGS. 13 and 14, the cavity 521 is disposed corresponding to each nozzle 511. The volume of the cavity 521 can be changed by vibration of the elastic film 55. The cavity 521 is configured to discharge the ink as a result of a change in volume.

A (110)-oriented single crystal silicon substrate is used as the base material for the ink chamber substrate 52. Since the (110)-oriented single crystal silicon substrate is suitable for anisotropic etching, the ink chamber substrate 52 can be easily and reliably formed. The single crystal silicon substrate is used so that the surface on which the elastic film 55 is formed is the (110) plane.

The elastic film 55 is disposed on the ink chamber substrate 52 on the side opposite to the nozzle plate 51. The piezoelectric sections 54 are disposed on the elastic film 55 on the side opposite to the ink chamber substrate 52. As shown in FIG. 14, a communication hole 531 is formed through the elastic film 55 in the thickness direction at a specific position of the elastic film 55. The ink is supplied to the reservoir 523 from the ink cartridge through the communication hole 531.

The piezoelectric section is electrically connected with a piezoelectric device driver circuit (not shown) and is actuated (vibrate or deformed) based on a signal from the piezoelectric device driver circuit. Specifically, the piezoelectric section 54 functions as a vibration source (head actuator). The elastic film 55 vibrates due to vibration (deflection) of the piezoelectric section 54, and functions to momentarily increase the pressure inside the cavity 521.

An example of the inkjet recording head which discharges ink is described above. However, this embodiment aims at a liquid jet head using a piezoelectric device and a liquid jet device in general. As the liquid jet head, a recording head used for an image recording device such as a printer, a color material jet head used to manufacture a color filter for a liquid crystal display or the like, an electrode material jet head used to form an electrode of an organic EL display, a field emission display (FED), or the like, a bio-organic substance jet head used to manufacture a bio-chip, and the like can be given.

6.4. Surface Acoustic Wave Device

Figure 16:
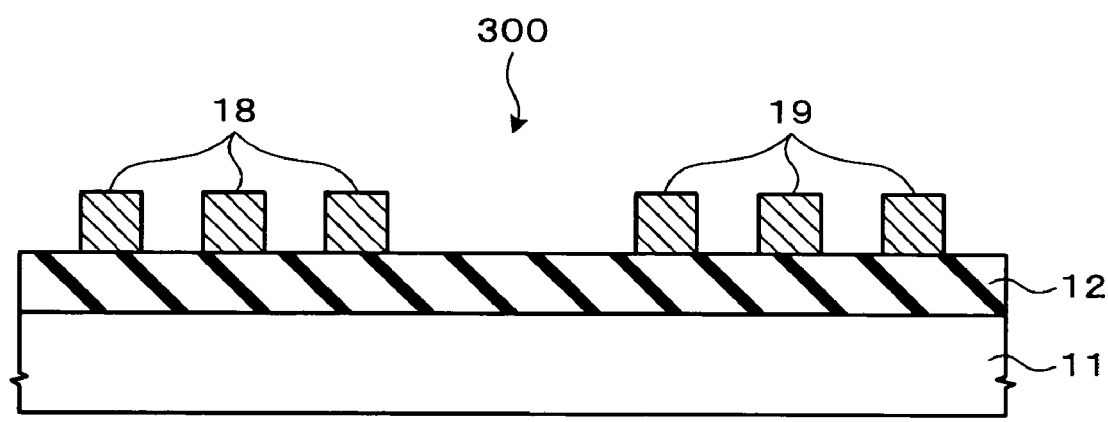
FIG. 16 is a cross-sectional view showing a surface acoustic wave device according to an application example of one embodiment of the invention.

An example of a surface acoustic wave device to which the insulating complex oxide film is applied is described below with reference to the drawings. FIG. 16 is a cross-sectional view schematically showing a surface acoustic wave device 300 according to this embodiment.

The surface acoustic wave device 300 includes a substrate 11, a piezoelectric film 12 formed on the substrate 11, and interdigital transducers (hereinafter called "IDT electrodes") 18 and 19 formed on the piezoelectric film 12. The IDT electrodes 18 and 19 have a specific pattern. The piezoelectric film 12 is formed by using the insulating complex oxide film.

The surface acoustic wave device 300 according to this embodiment is formed as described below using the piezoelectric film laminate, for example.

A conductive film is formed on the piezoelectric film 12 shown in FIG. 16. The IDT electrodes 18 and 19 are formed on the piezoelectric film 12 by patterning the conductive film using a known lithography technology and etching technology.

6.5. Frequency Filter

Figure 17:
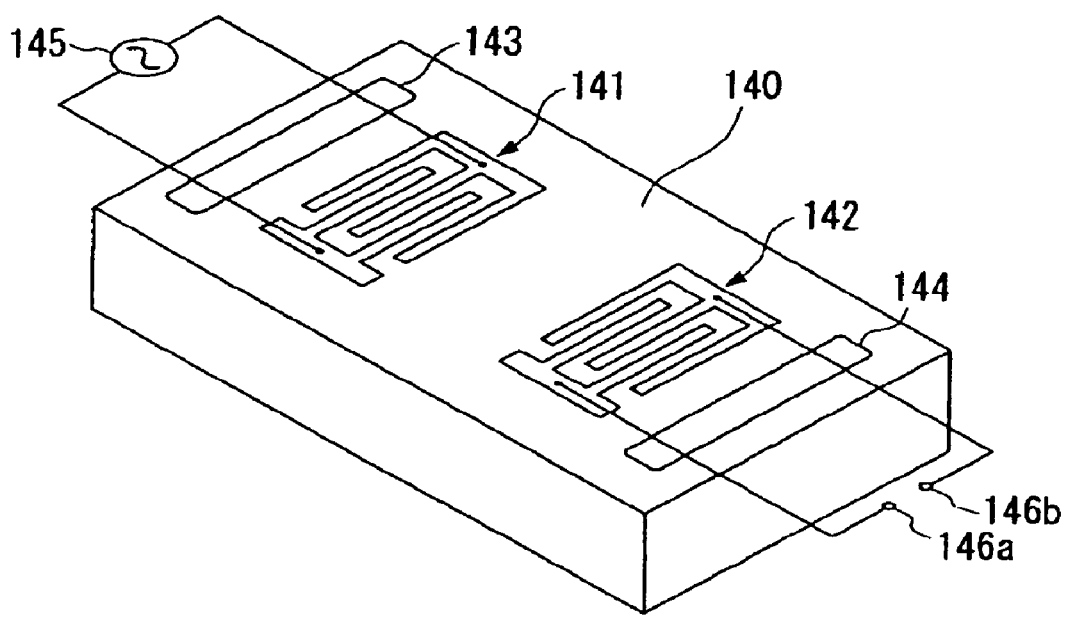
FIG. 17 is a perspective view showing a frequency filter according to an application example of one embodiment of the invention.

An example of a frequency filter to which the insulating complex oxide film is applied is described below with reference to the drawings. FIG. 17 is a view schematically showing the frequency filter according to this embodiment.

Figure 18:
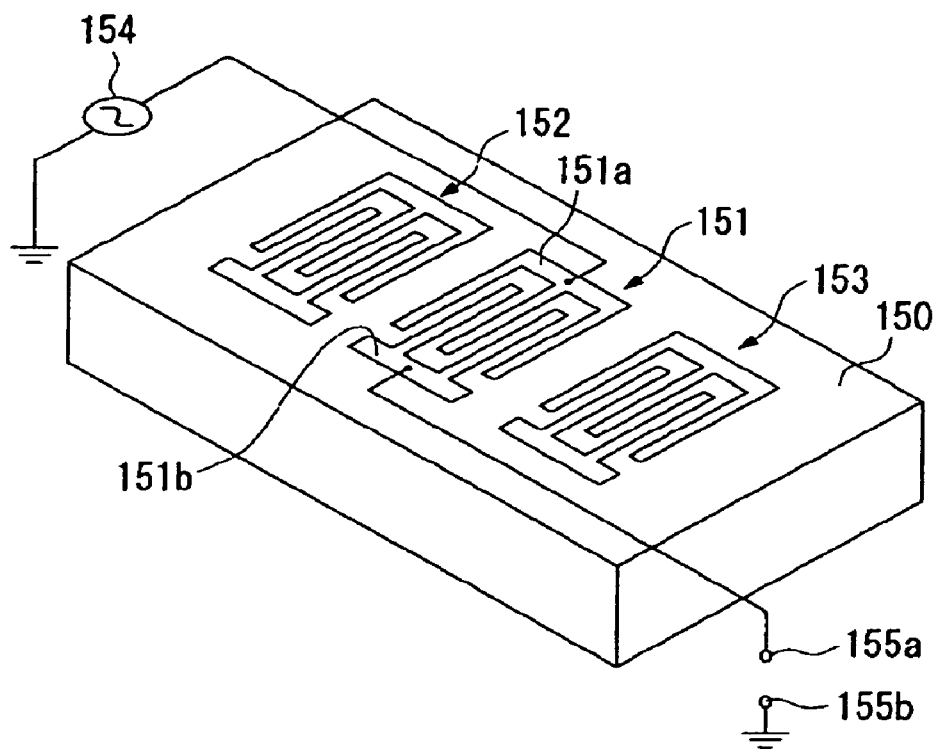
FIG. 18 is a perspective view showing an oscillator according to an application example of one embodiment of the invention.

As shown in FIG. 18, the frequency filter includes a base 140. As the base 140, a laminate (see FIG. 16) similar to that of the above-described surface acoustic wave device 300 may be used.

IDT electrodes 141 and 142 are formed on the upper side of the base 140. Sound absorbing sections 143 and 144 are formed on the upper side of the base 140 so that the IDT electrodes 141 and 142 are positioned between the sound absorbing sections 143 and 144. The sound absorbing sections 143 and 144 absorb surface acoustic waves propagated on the surface of the base 140. A high-frequency signal source 145 is connected with the IDT electrode 141, and signal lines are connected with the IDT electrode 142. The piezoelectric film may be formed by using the insulating complex oxide film.

The operation of the frequency filter is described below.

In the above configuration, when a high-frequency signal is output from the high-frequency signal source 145, the high-frequency signal is applied to the IDT electrode 141, whereby surface acoustic waves occur on the upper side of the base 140. The surface acoustic waves propagated from the IDT electrode 141 toward the sound absorbing section 143 are absorbed by the sound absorbing section 143. However, the surface acoustic waves propagated toward the sound absorbing section 142 and having a specific frequency determined by the pitch of the IDT electrode 142 or the like or having a frequency in a specific band are converted into electric signals, and supplied to terminals 146a and 146b through the signal lines. Most of the frequency components other than the specific frequency or the frequency in the specific band are absorbed by the sound absorbing section 144 through the IDT electrode 142. Therefore, it is possible to obtain (filter) only surface acoustic waves having the specific frequency or the frequency in the specific band from the electric signals supplied to the IDT electrode 141 of the frequency filter according to this embodiment.

6.6. Oscillator

An example of an oscillator to which the insulating complex oxide film is applied is described below with reference to the drawings. FIG. 18 is a view schematically showing the oscillator according to this embodiment.

As shown in FIG. 18, the oscillator includes a base 150. As the base 150, a laminate (see FIG. 16) similar to that of the above-described surface acoustic wave device 300 may be used.

An IDT electrode 151 is formed on the upper side of the base 150, and IDT electrodes 152 and 153 are formed so that the IDT electrode 151 is positioned between the IDT electrodes 152 and 153. A high-frequency signal source 154 is connected with a comb-shaped electrode 151a forming the IDT electrode 151, and a signal line is connected with the other comb-shaped electrode 151b. The IDT electrode 151 corresponds to an electrode for applying an electric signal, and the IDT electrodes 152 and 153 correspond to electrodes for causing a specific frequency component or a frequency component in a specific band of surface acoustic waves generated by the IDT electrode 151 to resonate. The piezoelectric film may be formed by using the insulating complex oxide film.

The operation of the oscillator is described below.

In the above configuration, when a high-frequency signal is output from the high-frequency signal source 154, the high-frequency signal is applied to the comb-shaped electrode 151a of the IDT electrode 151, whereby surface acoustic waves propagated toward the IDT electrode 152 and surface acoustic waves propagated toward the IDT electrode 153 are generated on the upper side of the base 150. The surface acoustic waves having a specific frequency component are reflected by the IDT electrodes 152 and 153 so that stationary waves occur between the IDT electrodes 152 and 153. The surface acoustic waves having a specific frequency component are repeatedly reflected by the IDT electrodes 152 and 153, whereby a specific frequency component or a frequency component in a specific band resonates to increase the amplitude. Part of the surface acoustic waves having the specific frequency component or the frequency component in the specific band is removed through the comb-shaped electrode 151b of the IDT electrode 151, whereby electric signals having a frequency corresponding to the resonant frequency of the IDT electrodes 152 and 153 (or frequency having a certain band) can be supplied to terminals 155a and 155b.

Figure 19:
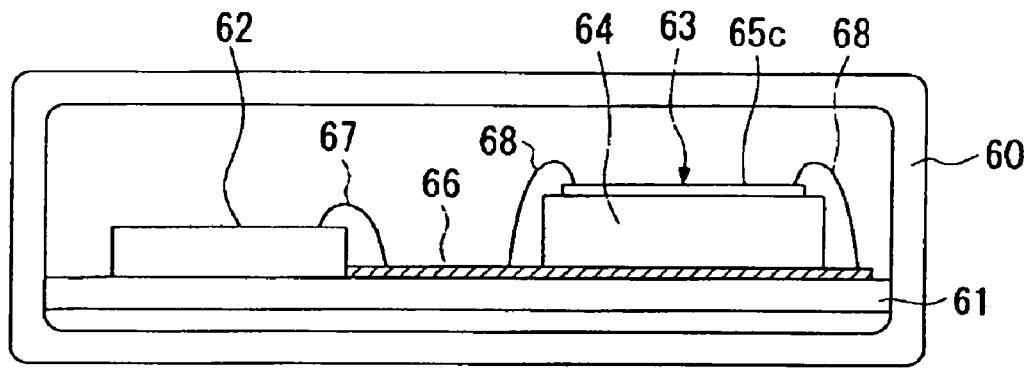
FIG. 19 is a schematic view showing an example in which an oscillator according to an application example of one embodiment of the invention is applied to a VCSO.
Figure 20:
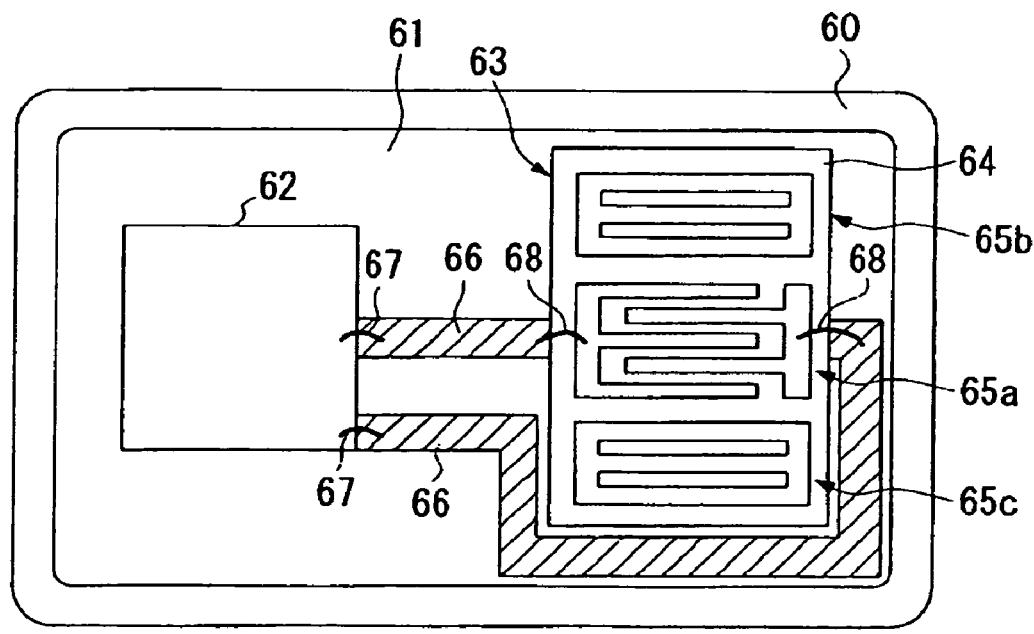
FIG. 20 is a schematic view showing an example in which an oscillator according to an application example of one embodiment of the invention is applied to a VCSO.

FIGS. 19 and 20 are views schematically showing an example in which the above-described oscillator is applied to a voltage controlled saw oscillator (VCSO). FIG. 19 is a side perspective view, and FIG. 20 is a top perspective view.

The VCSO is provided in a housing 60 made of a metal (aluminum or stainless steel). An integrated circuit (IC) 62 and an oscillator 63 are provided on a substrate 61. In this case, the IC 62 is an oscillating circuit which controls the frequency applied to the oscillator 63 corresponding to the voltage value input from an external circuit (not shown).

In the oscillator 63, IDT electrodes 65a to 65c are formed on a base 64. The configuration of the oscillator 63 is almost the same as the configuration of the oscillator shown in FIG. 18. As the base 64, a laminate similar to that of the oscillator shown in FIG. 18 may be used. The piezoelectric film may be formed by using the insulating complex oxide film.

An interconnect 66 for electrically connecting the IC 62 with the oscillator 63 is patterned on the substrate 61. The IC 62 and the interconnect 66 are connected through a wire 67 such as a gold wire, and the oscillator 63 and the interconnect 66 are connected through a wire 68 such as a gold wire. This allows the IC 62 and the oscillator 63 to be electrically connected through the interconnect 66.

The VCSO shown in FIGS. 19 and 20 is used as a voltage controlled oscillator (VCO) of a PLL circuit shown in FIG. 21, for example. FIG. 21 is a block diagram showing a basic configuration of the PLL circuit. The PLL circuit includes a phase comparator 71, a low-pass filter 72, an amplifier 73, and a VCO 74. The phase comparator 71 compares the phase (or frequency) of a signal input through an input terminal 70 with the phase (or frequency) of a signal output from the VCO 74, and generates an error voltage signal of which the value is set corresponding to the difference. The low-pass filter 72 allows only a low-frequency component at a position of the error voltage signal output from the phase comparator 71 to pass therethrough. The amplifier 73 amplifies the signal output from the low-pass filter 72. The VCO 74 is an oscillating circuit of which the oscillation frequency continuously changes within a certain range corresponding to the input voltage value.

The PLL circuit having such a configuration operates so that the difference between the phase (or frequency) of the signal input through the input terminal 70 and the phase (or frequency) of the signal output from the VCO 74 is decreased, and synchronizes the frequency of the signal output from the VCO 74 with the frequency of the signal input through the input terminal 70. When the frequency of the signal output from the VCO 74 has been synchronized with the frequency of the signal input through the input terminal 70, the PLL circuit outputs a signal which coincides with the signal input through the input terminal 70 excluding a specific phase difference and follows a change in the input signal.

As described above, the frequency filter and the oscillator according to this embodiment include the surface acoustic wave device having a large electromechanical coupling factor. According to this embodiment, the size of the frequency filter and the oscillator can be reduced.

6.7. First Electronic Instrument

Figure 22:
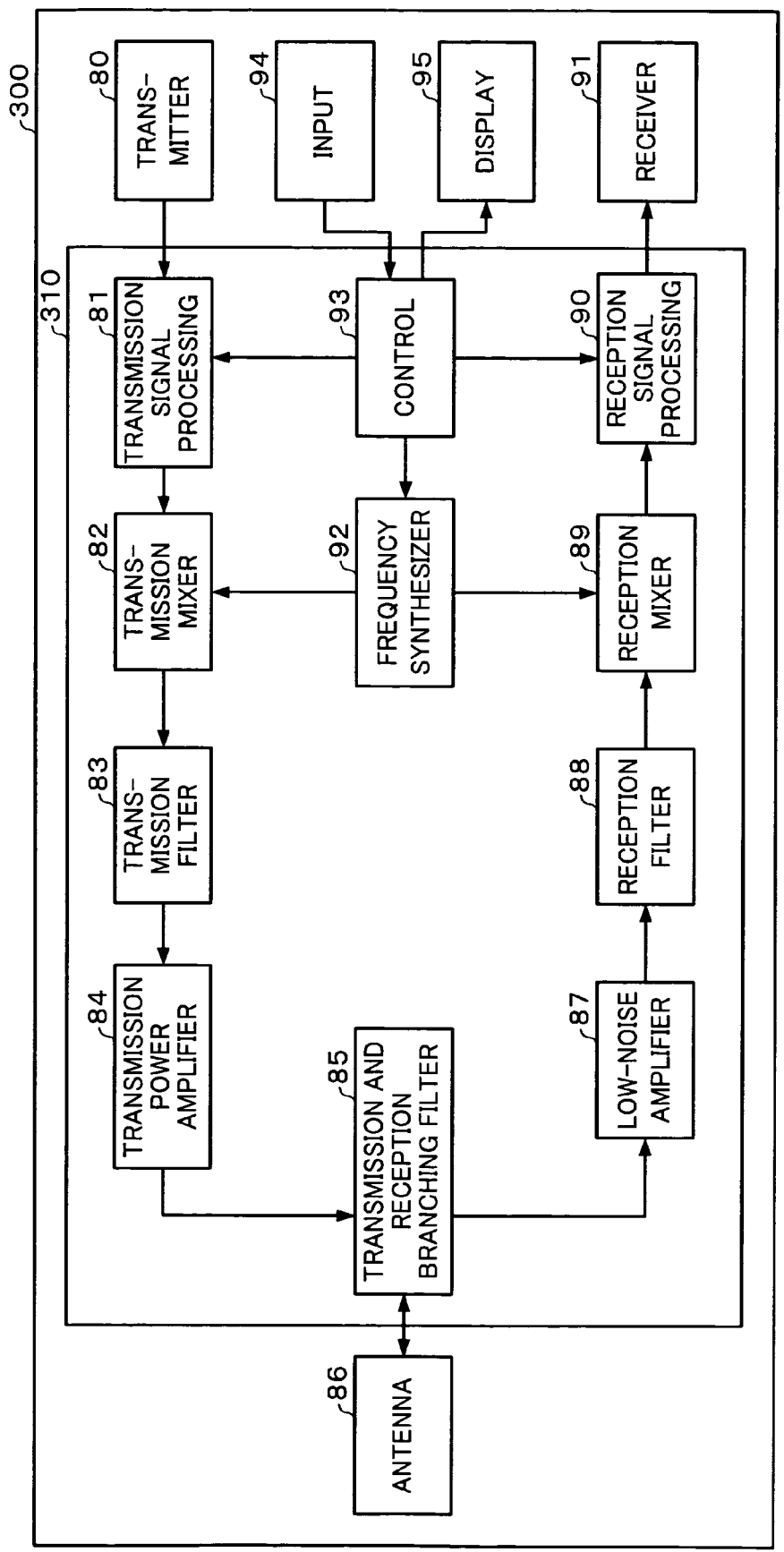
FIG. 22 is a block diagram showing a configuration of an electronic circuit according to an application example of one embodiment of the invention.

A first example of an electronic circuit and an electronic instrument according to one embodiment of the invention is described below with reference to the drawings. FIG. 22 is a block diagram showing the electrical configuration of the electronic instrument according to this embodiment. The electronic instrument is a portable telephone, for example.

An electronic instrument 300 includes an electronic circuit 310, a transmitter 80, a receiver 91, an input section 94, a display section 95, and an antenna section 86. The electronic circuit 310 includes a transmission signal processing circuit 81, a transmission mixer 82, a transmission filter 83, a transmission power amplifier 84, a transmission and reception branching filter 85, a low-noise amplifier 87, a reception filter 88, a reception mixer 89, a reception signal processing circuit 90, a frequency synthesizer 92, and a control circuit 93.

In the electronic circuit 310, the frequency filter shown in FIG. 17 may be used as the transmission filter 83 and the reception filter 88. The frequency to be filtered (frequency allowed to pass) is individually set for the transmission filter 83 and the reception filter 88 corresponding to the necessary frequency of the signal output from the transmission mixer 82 and the frequency necessary for the reception mixer 89. As the VCO 74 of the PLL circuit (see FIG. 21) provided in the frequency synthesizer 92, the oscillator shown in FIG. 18 or the VCSO shown in FIGS. 19 and 20 may be used.

The transmitter 80 is realized by a microphone which converts a sound wave signal into an electric signal, for example. The transmission signal processing circuit 81 is a circuit which performs processing such as D/A conversion or modulation for an electric signal output from the transmitter 80. The transmission mixer 82 mixes the signal output from the transmission signal processing circuit 81 by using the signal output from the frequency synthesizer 92. The transmission filter 83 allows only a signal having a frequency for which an intermediate frequency (hereinafter abbreviated as "IF") is necessary to pass therethrough, and removes a signal having an unnecessary frequency. The signal output from the transmission filter 83 is converted into an RF signal by a conversion circuit (not shown). The transmission power amplifier 84 amplifies electric power of the RF signal output from the transmission filter 83, and outputs it to the transmission and reception branching filter 85.

The transmission and reception branching filter 85 outputs the RF signal output from the transmission power amplifier 84 to the antenna section 86, and transmits the RF signal from the antenna section 86 as radio waves. The transmission and reception branching filter 85 branches a signal received by the antenna section 86, and outputs the resulting signal to the low-noise amplifier 87. The low-noise amplifier 87 amplifies the signal received from the transmission and reception branching filter 85. The signal output from the low-noise amplifier 87 is converted into an IF by a conversion circuit (not shown).

The reception filter 88 allows only a signal having a frequency for which an IF converted by the conversion circuit (not shown) is necessary to pass therethrough, and removes a signal having an necessary frequency. The reception mixer 89 mixes the signal output from the reception filter 88 by using the signal output from the frequency synthesizer 92. The reception signal processing circuit 90 is a circuit which performs processing such as A/D conversion or demodulation for the signal output from the reception mixer 89. The receiver 91 is realized by a small speaker which converts electric signals into sound waves, for example.

The frequency synthesizer 92 is a circuit which generates a signal supplied to the transmission mixer 82 and a signal supplied to the reception mixer 89. The frequency synthesizer 92 includes a PLL circuit, and generates a signal by dividing the frequency of a signal output from the PLL circuit. The control circuit 93 controls the transmission signal processing circuit 81, the reception signal processing circuit 90, the frequency synthesizer 92, the input section 94, and the display section 95. The display section 95 displays the state of the instrument to the user of the portable telephone, for example. The input section 94 allows the user of the portable telephone to input instructions, for example.

6.8. Second Electronic Instrument

Figure 23:
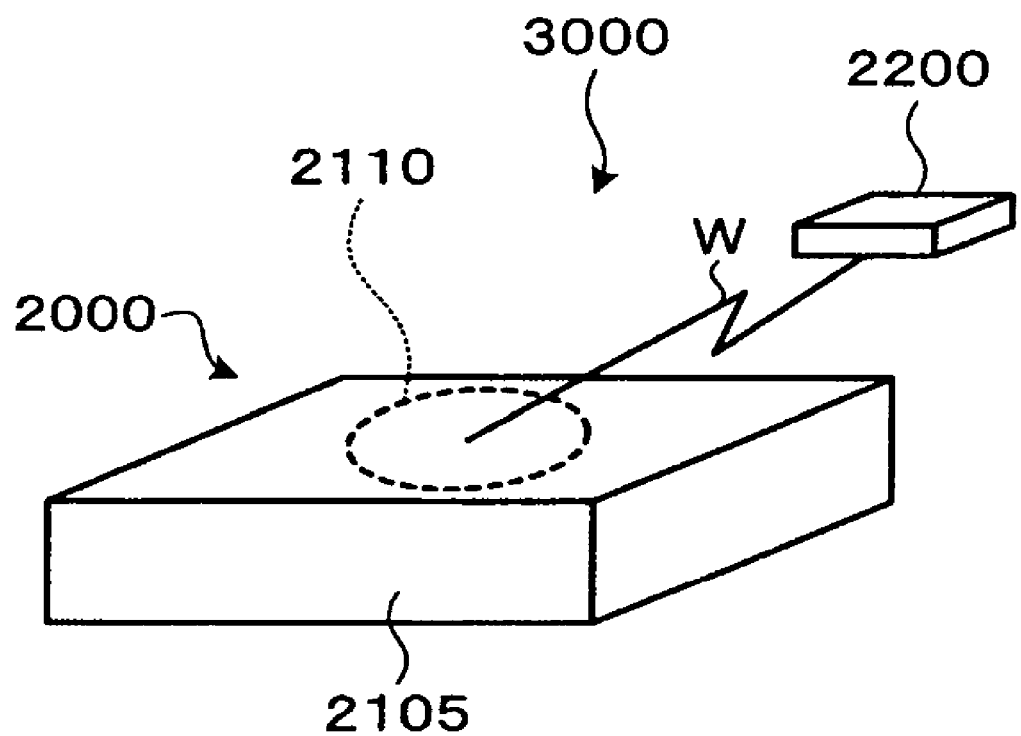
FIG. 23 shows a communication system using a reader/writer according to an application example of one embodiment of the invention.
Figure 24:
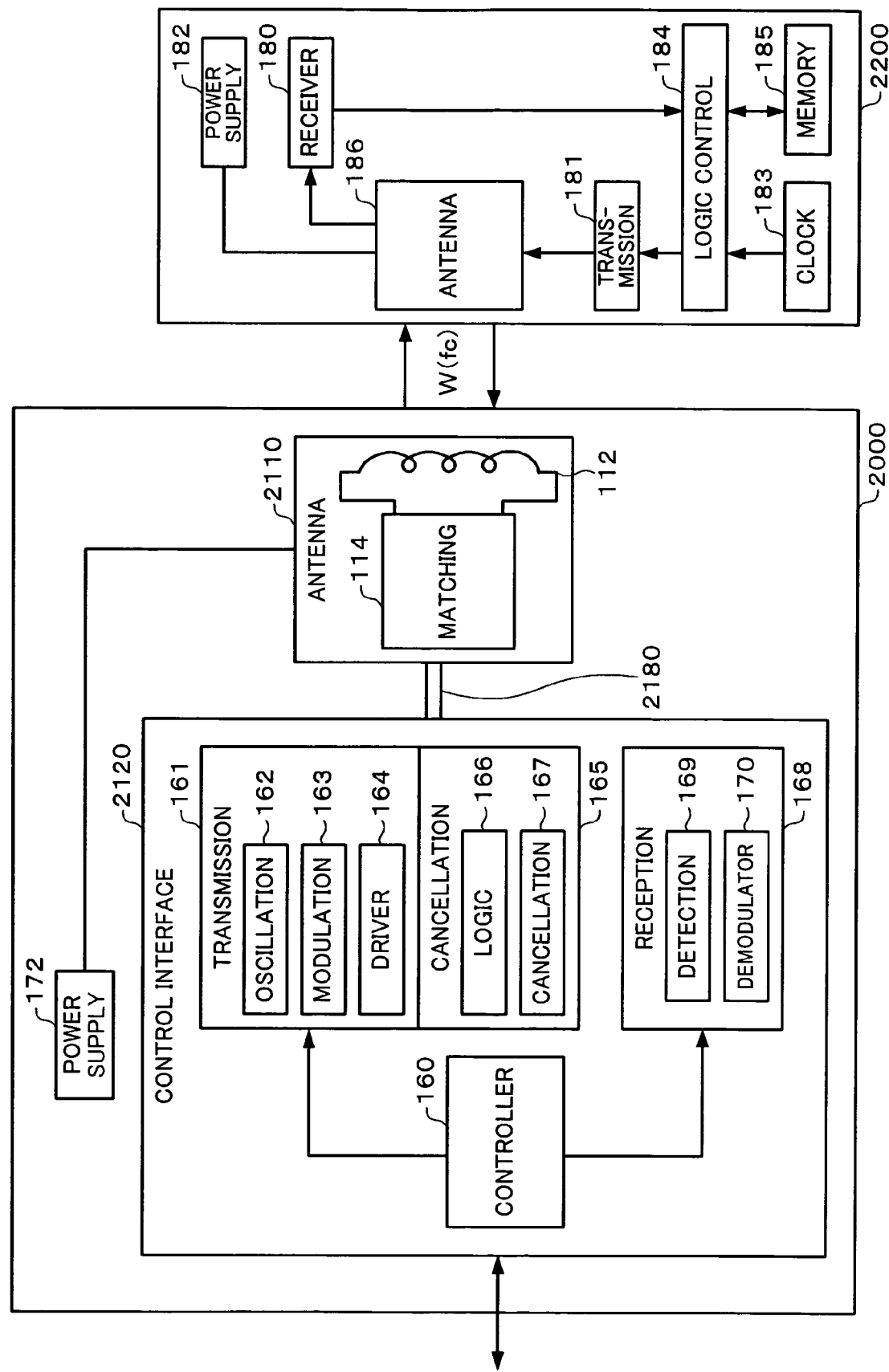
FIG. 24 is a schematic block diagram of the communication system shown in FIG. 23.

A second example of an electronic circuit and an electronic instrument according to one embodiment of the invention is described below with reference to the drawings. In this embodiment, a reader/writer 2000 and a communication system 3000 using the reader/writer 2000 are described as an example of the device. FIG. 23 is a view showing the communication system 3000 using the reader/writer 2000 according to this embodiment, and FIG. 24 is a schematic block diagram of the communication system 3000 shown in FIG. 23.

As shown in FIG. 23, the communication system 3000 includes the reader/writer 2000 and a contactless information medium 2200. The reader/writer 2000 transmits or receives radio waves W (hereinafter may be called "carrier") having a carrier frequency $f_c$ to or from the contactless information medium 2200, and communicates with the contactless information medium 2200 using wireless communication. The carrier frequency $f_c$ of the radio wave W may be a carrier frequency in an arbitrary frequency band. As shown in FIGS. 23 and 24, the reader/writer 2000 includes a main body 2105, an antenna section 2110 positioned on the upper side of the main body 2105, a control interface section 2120 provided in the main body 2105, and a power supply circuit 172. The antenna section 2110 and the control interface section 2120 are electrically connected through a cable 2180. The reader/writer 2000 is connected with an external host device (e.g. processing device) through the control interface section 2120 (not shown).

The antenna section 2110 has the function of transmitting and receiving information to and from the contactless information medium 2200. As shown in FIG. 23, the antenna section 2110 has a specific communication area (area indicated by the dotted line). The antenna section 2110 includes a loop antenna 112 and a matching circuit 114.

The control interface section 2120 includes a transmission section 161, a damped oscillation cancellation section (hereinafter called "cancellation section") 140, a reception section 168, and a controller 160.

The transmission section 161 modulates data transmitted from an external device (not shown), and transmits the modulated data to the loop antenna 112. The transmission section 161 includes an oscillation circuit 162, a modulation circuit 163, and a driver circuit 164. The oscillation circuit 162 is a circuit for generating a carrier having a specific frequency. The oscillation circuit 162 is generally formed by using a quartz oscillator or the like. The communication frequency and the detection sensitivity can be increased by using the above-described oscillator. The modulation circuit 163 is a circuit which modulates the carrier according to information provided. The driver circuit 164 receives the modulated carrier and amplifies electric power to drive the antenna section 2110.

The cancellation section 165 has the function of reducing the damped oscillation caused by the loop antenna 112 of the antenna section 2110 along with turning the carrier ON/OFF. The cancellation section 165 includes a logic circuit 166 and a cancellation circuit 167.

The reception section 168 includes a detection section 169 and a demodulator circuit 170. The reception section 168 restores a signal transmitted from the contactless information medium 2200. The detection section 169 detects a change in current which flows through the loop antenna 112, for example. The demodulator circuit 170 is a circuit which demodulates the change detected by the detection section 169.

The controller 160 acquires information from the demodulated signal and transfers the information to the external device. The power supply circuit 172 receives power from the outside, arbitrarily performs voltage conversion, and supplies necessary power to each circuit. A built-in cell may be used as the power supply.

The contactless information medium 2200 communicates with the reader/writer 2000 using electromagnetic waves (radio waves). As examples of the contactless information medium 2200, a contactless IC tag, a contactless IC card, and the like can be given.

The operation of the communication system 3000 using the reader/writer 2000 according to this embodiment is described below. When data is transferred to the contactless information medium 2200 from the reader/writer 2000, data from the external device (not shown) is processed by the controller 160 of the reader/writer 2000, and transmitted to the transmission section 161. In the transmission section 161, a high-frequency signal having a specific amplitude is supplied as the carrier from the oscillation circuit 162. The carrier is modulated by the modulation circuit 163 so that the modulated high-frequency signal is output. The modulated high-frequency signal output from the modulation circuit 163 is supplied to the antenna section 2110 through the driver circuit 164. The cancellation section 165 generates a specific pulse signal in synchronization with the OFF timing of the modulated high-frequency signal to contribute to a reduction in the damped oscillation in the loop antenna 112.

In the contactless information medium 2200, the modulated high-frequency signal is supplied to the receiver circuit 180 through the antenna section 186. The modulated high-frequency signal is also supplied to the power supply circuit 182 so that a specific power supply voltage necessary for each section of the contactless information medium 2200 is generated. The data output from the receiver circuit 180 is demodulated and supplied to the logic control circuit 184. The logic control circuit 184 operates based on the output from a clock 183. The logic control circuit 184 processes the supplied data and writes specific data into a memory 185.

When data is transferred to the reader/writer 2000 from the contactless information medium 2200, an unmodulated high-frequency signal having a specific amplitude is output from the modulation circuit 163 of the reader/writer 2000. The high-frequency signal is transferred to the contactless information medium 2200 through the driver circuit 164 and the loop antenna 112 of the antenna section 2110.

In the contactless information medium 2200, the data read from the memory 185 is processed by the logic control circuit 184 and supplied to the transmission circuit 181. In the transmission circuit 181, the switch is turned ON/OFF depending on the "1" or "0" bit of the data.

In the reader/writer 2000, the load of the loop antenna 112 of the antenna section 2110 changes when the switch of the transmission circuit 181 is turned ON/OFF. Therefore, the amplitude of the high frequency current which flows through the loop antenna 112 changes. Specifically, the amplitude of the high frequency current is modulated by the data supplied from the contactless information medium 2200. The high frequency current is detected by the detection section 169 of the reception section 168 and demodulated by the demodulator circuit 170 to obtain data. The data is processed by the controller 160 and transmitted to the external device or the like.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of this invention.

For example, the frequency filter and the oscillator according to one embodiment of the invention may be respectively applied to a broadband filter and a VCO in a UWB system, portable telephone, wireless LAN, and the like.

In the above-described embodiments, the communication system using the portable telephone and the reader/writer is described as an example of the device, and the electronic circuit provided in the portable telephone and the reader/writer is described as an example of the electronic circuit. However, the invention is not limited thereto. The invention may be applied to various mobile communication instruments and electronic circuits provided therein. For example, the invention may also be applied to communication instruments used in a stationary state such as a tuner which receives broadcast satellite (BS) broadcasts and electronic circuits provided therein, and devices such as a HUB using an optical signal propagated through an optical cable and electronic circuits provided therein.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

What is claimed is:

1. A method of manufacturing an insulating target material comprising:
   preparing a first precursor composition including a raw material solution including Pb, Zr, Ti and Nb, a polycarboxylic acid or a polycarboxylic acid ester, and an organic solvent;
   forming a first powder of a complex oxide including Pb, Zr, Ti and Nb by spray drying the first precursor composition while simultaneously heating the first precursor composition; and
   forming a second powder by subjecting the first powder and a second precursor composition that is obtained by mixing a basic substance with the first precursor composition to hydrothermal synthesis to allow a complex oxide including Pb, Zr, Ti and Nb to be grown around particles of the first powder,
   wherein the second powder includes Nb in an amount of 10 to 30 mol %.

2. The method of manufacturing an insulating target material as defined in claim 1, wherein the first precursor composition and the second precursor composition further include Si.

3. The method of manufacturing an insulating target material as defined in claim 1, further comprising:
    obtaining a third powder by collecting the second powder after the second powder has been mixed with a solution including a Si raw material and/or a Ge raw material; and
    forming the third powder by bonding.

4. The method of manufacturing an insulating target material as defined in claim 3,
    wherein the solution includes the Si raw material and/or the Ge raw material in an amount of 2 to 10 mol %.

5. The method of manufacturing an insulating target material as defined in claim 1,
    wherein a raw material of the Pb includes a carboxylate,
    wherein a raw material of the Zr and the Ti includes a sol-gel raw material, and
    wherein a raw material of the Nb includes a carboxylate.

6. The method of manufacturing an insulating target material as defined in claim 5,
    wherein the raw material of the Pb includes a lead acetate and/or a lead octylate.

7. The method of manufacturing an insulating target material as defined in claim 5,
    wherein the raw material of the Nb includes niobium octylate and/or niobium lead octylate.

\* \* \* \* \*